(12) United States Patent
Fujinami

(10) Patent No.: US 10,310,742 B2
(45) Date of Patent: Jun. 4, 2019

(54) MEMORY CONTROLLER, STORAGE APPARATUS, INFORMATION PROCESSING SYSTEM, AND METHOD FOR CONTROLLING NONVOLATILE MEMORY

(71) Applicant: Sony Corporation, Tokyo (JP)

(72) Inventor: Yasushi Fujinami, Tokyo (JP)

(73) Assignee: Sony Corporation, Tokyo (JP)

( * ) Notice: Subject to any disclaimer, the term of this patent is extended or adjusted under 35 U.S.C. 154(b) by 24 days.

(21) Appl. No.: 15/505,826

(22) PCT Filed: Jul. 14, 2015

(86) PCT No.: PCT/JP2015/070094
§ 371 (c)(1),
(2) Date: Feb. 22, 2017

(87) PCT Pub. No.: WO2016/042902
PCT Pub. Date: Mar. 24, 2016

(65) Prior Publication Data
US 2017/0277442 A1    Sep. 28, 2017

(30) Foreign Application Priority Data
Sep. 16, 2014    (JP) ................. 2014-187692

(51) Int. Cl.
*G06F 12/00*    (2006.01)
*G06F 3/06*     (2006.01)
(Continued)

(52) U.S. Cl.
CPC .......... *G06F 3/0611* (2013.01); *G06F 3/0613* (2013.01); *G06F 12/023* (2013.01);
(Continued)

(58) Field of Classification Search
USPC ................ 711/100, 103, 154, 200
See application file for complete search history.

(56) References Cited

U.S. PATENT DOCUMENTS

2011/0214025 A1\* 9/2011 Seko .................. G11C 13/0004
714/720
2014/0219001 A1\* 8/2014 Patapoutian ....... G11C 13/0002
365/148

FOREIGN PATENT DOCUMENTS

JP    2009-252253 A    10/2009
JP    2011-060388 A    3/2011
(Continued)

OTHER PUBLICATIONS

Yue et al, Exploiting Subarrays Inside a Bank to Improve Pahse CHange Memory Performance, 2013.\*
(Continued)

*Primary Examiner* — Tuan V Thai
(74) *Attorney, Agent, or Firm* — Michael Best & Friedrich LLP

(57) ABSTRACT

The write reliability of a nonvolatile memory is improved by performing accurate verification of write data. In a memory controller of an information processing system, a determination unit determines whether a state of a memory cell after writing data is stable in a nonvolatile memory including the memory cell having an unstable state period after writing data. A verification unit performs verification by comparing read data which is read from the memory cell where the data is written on the basis of a result of the determination, with write data involved in the writing. A write control unit performs writing of the data and rewriting of the write data based on a result of the verification.

11 Claims, 38 Drawing Sheets

(51) Int. Cl.
*G06F 12/16* (2006.01)
*G06F 12/02* (2006.01)
*G11C 13/00* (2006.01)
*G11C 16/34* (2006.01)

(52) U.S. Cl.
CPC .......... *G06F 12/16* (2013.01); *G11C 13/0033* (2013.01); *G11C 13/0064* (2013.01); *G11C 16/3418* (2013.01); *G11C 16/3431* (2013.01); *G11C 16/3459* (2013.01); *G11C 2013/0076* (2013.01)

(56) References Cited

FOREIGN PATENT DOCUMENTS

| JP | 2011-181134 A | 9/2011 |
| JP | 2013-228767 A | 11/2013 |
| JP | 2014-041573 A | 3/2014 |
| JP | 2014-154205 A | 8/2014 |
| WO | WO-2011/121971 A1 | 10/2011 |

OTHER PUBLICATIONS

T. O. Iwasaki et al., "Stability Conditioning to Enhance Read Stability 10x in 50nm $Al_xO_y$ ReRAM," IEEE (Article), University of Tokyo (Japan), pp. 44-47, 2013.
Japanese Office Action dated Nov. 13, 2018 for corresponding Japanese Application No. 2016-548608.

* cited by examiner

*FIG. 6*

| WRITE DATA | 0 | 0 | 0 | 0 | 1 | 1 | 1 | 1 |
|---|---|---|---|---|---|---|---|---|
| DATA IN MEMORY CELLS | 1 | 1 | 1 | 1 | 1 | 1 | 1 | 1 |
| RESET OPERATION DATA | 1 | 1 | 1 | 1 | 0 | 0 | 0 | 0 |

<u>a</u>

| WRITE DATA | 0 | 0 | 0 | 0 | 1 | 1 | 1 | 1 |
|---|---|---|---|---|---|---|---|---|
| READ DATA | 0 | 1 | 0 | 1 | 0 | 1 | 0 | 1 |
| RESET OPERATION DATA | 0 | 1 | 0 | 1 | 0 | 0 | 0 | 0 |
| SET OPERATION DATA | 0 | 0 | 0 | 0 | 1 | 0 | 1 | 0 |

<u>b</u> a b

MEMORY CONTROLLER, STORAGE APPARATUS, INFORMATION PROCESSING SYSTEM, AND METHOD FOR CONTROLLING NONVOLATILE MEMORY

TECHNICAL FIELD

The present technology relates to a memory controller. More specifically, the present technology relates to a memory controller, a storage apparatus, an information processing system, and a method for controlling a nonvolatile memory that perform writing of data and verification on a nonvolatile memory.

BACKGROUND ART

Conventionally, a NAND type flash memory which is a nonvolatile memory is widely used as an auxiliary storage apparatus of an information processing system. The NAND type flash memory stores data by accumulating a charge on a floating gate disposed in a MOS transistor in a memory cell. On the other hand, a nonvolatile memory of a type that stores data by changing a physical property of a storage element in a memory cell is receiving attention due to its advantages such as high speed performance and random access capability. Examples of such a nonvolatile memory include a phase-change RAM (PCRAM) and a resistance RAM (ReRAM). In addition, nonvolatile memories that use a magnetic material, such as a magnetoresistive RAM (MRAM) and a spin transfer torque-MRAM (STT-MRAM), also correspond to such a nonvolatile memory.

The PCRAM stores data by changing the electrical resistance of a storage element which is a phase-change element and is disposed in a memory cell. Specifically, storage operation is performed by bringing the state of the storage element into a crystalline state or an amorphous state and utilizing a difference in electrical resistance made thereby. The storage element has a low resistance when in the crystalline state, and has a high resistance when in the amorphous state. Here, the operation of bringing the storage element into a low-resistance state is represented as a set operation, and the operation of bringing the storage element into a high-resistance state is represented as a reset operation. By performing reset and set operations on the memory cell, writing of data in the PCRAM is performed.

To change the state of the storage element, there is a need to heat the storage element by applying a voltage (write voltage) to the storage element to allow a current to flow therethrough. By changing a temperature and a heating time condition at that time, the state of the storage element is brought into a crystalline state or an amorphous state. When a substantially melting point temperature and a short-time heating condition are set for the storage element, the storage element goes into an amorphous state and thus a reset operation is performed. On the other hand, when a crystallization temperature which is a lower temperature than a melting point and a long-time heating condition are set, the storage element is crystallized and thus a set operation is performed. When the crystallization temperature of the storage element exceeds an allowable range and varies in such a PCRAM, the storage element cannot be sufficiently crystallized, by which a set operation may not be able to be performed. In view of this, there is proposed a system in which upon a set operation, a storage element is brought to a substantially melting point and then a write voltage is gradually reduced to slowly cool the storage element, by which even when the crystallization temperature varies, a set operation can be performed (see, for example, Patent Document 1).

As with the PCRAM, the ReRAM also stores data by changing the electrical resistance of a storage element disposed in a memory cell. The storage element of the ReRAM has two-layer structure including an insulating layer and a metal ion supplying layer. When a voltage is applied to the storage element, conductive filaments composed of metal ions which are supplied from the metal ion supplying layer are diffused into the insulating layer, going into a low-resistance state. On the other hand, when a reverse-polarity voltage is applied, the metal ions in the diffused conductive filaments return to the metal ion supplying layer, and thus, the storage element goes into a high-resistance state. Note that in the ReRAM, too, the operation of bringing the storage element into a low-resistance state is represented as a set operation, and the operation of bringing the storage element into a high-resistance state is represented as a reset operation. In such a ReRAM, there is known a phenomenon where the state of the storage element is not stable immediately after performing reset and set operations which are data write operation. This is a phenomenon where the resistance value of the storage element immediately after writing data becomes a value near a threshold value that determines whether the state is a low-resistance or high-resistance value, and with the passage of time the resistance value settles to a normal resistance value (see, for example, Non-Patent Document 1).

CITATION LIST

Patent Document

Patent Document 1: Japanese Patent Application Laid-Open No. 2009-252253

Non-Patent Document

Non-Patent Document 1: T. O. Iwasaki, et. al "Stability Conditioning to Enhance Read Stability 10× in 50 nm AlxOy ReRAM", IEEE International Memory Workshop (IMW2013), pp 44-47.

SUMMARY OF THE INVENTION

Problems to be Solved by the Invention

In a nonvolatile memory, there is a need to verify whether correct data is written after writing data. Hence, after writing data, the data is read and a comparison is made between the read data and data involved in the writing. The above-described PCRAM performs this reading by applying a voltage (read voltage) lower than a write voltage to a storage element and measuring the resistance value of the storage element. However, upon writing, the storage element is heated and crystallized during a cooling period, and thus, during this period the state of the storage element becomes unstable. Therefore, if the read voltage is applied during this period, then the state of the storage element changes, by which written data may be corrupted.

In addition, in the ReRAM, too, as described above, the state of a storage element becomes unstable immediately after writing data. If reading is performed during this period, data is not read normally, and thus, as a result of verification, it is determined to be write failure. As such, in a nonvolatile memory of a type that writes data by changing a physical property of a storage element, an unstable period associated with the change in physical property is present immediately after the writing. Hence, if reading of data for verification is performed immediately after writing data, then there is a possibility that it may be determined to be write failure. As a result, there is a problem of a reduction in write reliability.

The present technology is made in view of such circumstances, and an object of the present technology is to improve the write reliability of a nonvolatile memory by performing accurate verification of write data.

Solutions to Problems

The present technology is made to solve the above-described problem. A first aspect of the present technology is a memory controller including: a determination unit that determines whether a state of a memory cell after writing data is stable in a nonvolatile memory including the memory cell, the memory cell having an unstable state period after writing data; a verification unit that performs verification by comparing read data with write data involved in the writing, the read data being read from the memory cell where the data is written on the basis of a result of the determination; and a write control unit that performs writing of the data and rewriting of the write data based on a result of the verification. By this, action is brought about where verification is performed after determining whether the state of the memory cell in the nonvolatile memory is stable.

In addition, in the first aspect, the nonvolatile memory may be a nonvolatile memory in which when reading is performed immediately after writing the data, the written data is corrupted. By this, in the nonvolatile memory, too, in which when reading is performed immediately after writing the data, the written data is corrupted, action is brought about where verification is performed after determining whether the state of the memory cell in the nonvolatile memory is stable.

In addition, in the first aspect, the nonvolatile memory may be a nonvolatile memory in which immediately after writing the data, the written data is not read normally. By this, in the nonvolatile memory, too, in which immediately after writing the data, the written data is not read normally, action is brought about where verification is performed after determining whether the state of the memory cell in the nonvolatile memory is stable.

In addition, in the first aspect, the determination unit may make the determination on the basis of a lapse of predetermined stabilization time after writing the data. By this, action is brought about where the determination is made on the basis of a lapse of the predetermined stabilization time.

In addition, in the first aspect, the nonvolatile memory may be accessed on a page-by-page basis, using a page address, the write control unit may continuously write data of a plurality of pages, the verification unit may perform the verification on a page-by-page basis in order in which the data is written, and the determination unit may determine that a state of corresponding memory cells is stable upon the verification. By this, action is brought about where the state of the memory cells is stable after writing data of a plurality of pages.

In addition, in the first aspect, a rewrite address information holding unit that holds rewrite address information may be further included, the rewrite address information being information on a page address in the nonvolatile memory where the rewriting is to be performed, and the verification unit may continuously perform the verification after writing the data of a plurality of pages, and allow the rewrite address information holding unit to hold rewrite address information based on a result of the verification, and the write control unit may perform the rewriting on the basis of the held rewrite address information. By this, action is brought about where rewriting is performed on the basis of rewrite address information.

In addition, in the first aspect, a verification address information holding unit that holds verification address information may be further included, the verification address information being information on a page address in the nonvolatile memory where the verification is to be performed, and when the write control unit performs the writing and the rewriting, the write control unit may allow the verification address information holding unit to hold, as the verification address information, information on a page address where the writing and the rewriting have been performed, and the verification unit may perform the verification on the basis of the held verification address information. By this, action is brought about where verification is performed on the basis of verification address information.

In addition, in the first aspect, the nonvolatile memory may be accessed on a page-by-page basis, using a page address, the write control unit may continuously write data of a plurality of pages, the verification unit may perform the verification on a page-by-page basis in order in which the data is written, and when a number of pages of the write data is greater than or equal to a number of pages with a stabilized state, the determination unit may determine that a state of corresponding memory cells is stable upon the verification, and when the number of pages of the write data is less than the number of pages with a stabilized state, the determination unit may wait for predetermined stabilization time to have elapsed, and then determine that the state of the corresponding memory cells is stable, the number of pages with a stabilized state being a number of pages where write time is reached, the write time corresponding to the predetermined stabilization time after writing data in the nonvolatile memory. By this, action is brought about where after writing data of a plurality of pages, the determination is made on the basis of the number of pages of the write data, and when the number of pages of the write data is smaller than the predetermined number of pages with a stabilized state, the determination is made on the basis of a lapse of the predetermined stabilization time.

In addition, in the first aspect, there may be included a write control unit that writes data in a nonvolatile memory including a memory cell, the memory cell having an unstable state period after writing data; a determination unit that determines whether a state of the memory cell after writing the data is stable; and a verification/writing unit that performs verification where read data is compared with write data involved in the writing, and performs rewriting of the write data based on a result of the verification, the read data being read from the memory cell where the data is written on the basis of a result of the determination. By this, action is brought about where verification is performed after determining whether the state of the memory cell in the nonvolatile memory is stable.

In addition, a second aspect of the present technology is a storage apparatus including: a nonvolatile memory including a memory cell, the memory cell having an unstable state period after writing data; a determination unit that determines whether a state of the memory cell after writing data is stable in the nonvolatile memory; a verification unit that performs verification by comparing read data with write data involved in the writing, the read data being read from the memory cell where the data is written on the basis of a result of the determination; and a write control unit that performs writing of the data and rewriting of the write data based on a result of the verification. By this, action is brought about where verification is performed after determining whether the state of the memory cell in the nonvolatile memory is stable.

In addition, a third aspect of the present technology is an information processing system including: a nonvolatile memory including a memory cell, the memory cell having an unstable state period after writing data; a memory controller that controls the nonvolatile memory; and a host computer that accesses the nonvolatile memory through the memory controller. The memory controller includes: a determination unit that determines whether a state of the memory cell after writing data is stable in the nonvolatile memory; a verification unit that performs verification by comparing read data with write data involved in the writing, the read data being read from the memory cell where the data is written on the basis of a result of the determination; and a write control unit that performs writing of the data and rewriting of the write data based on a result of the comparison. By this, action is brought about where verification is performed after determining whether the state of the memory cell in the nonvolatile memory is stable.

In addition, a fourth aspect of the present technology is a method for controlling a nonvolatile memory, the method including: a determining step of determining whether a state of a memory cell after writing data is stable in a nonvolatile memory including the memory cell, the memory cell having an unstable state period after writing data; a verifying step of performing verification by comparing read data with write data involved in the writing, the read data being read from the memory cell where the data is written on the basis of a result of the determination; and a write controlling step of performing writing of the data and rewriting of the write data based on a result of the comparison. By this, action is brought about where verification is performed after determining whether the state of the memory cell in the nonvolatile memory is stable.

Effects of the Invention

According to the present technology, an excellent effect can be provided that the write reliability of a nonvolatile memory is improved by performing accurate verification of write data. Note that effects are not necessarily limited to the effects described here and may be any of the effects described in the present disclosure.

BRIEF DESCRIPTION OF DRAWINGS

FIG. 6 is a diagram describing a write operation of the first embodiment of the present technology.

MODE FOR CARRYING OUT THE INVENTION

Modes for carrying out the present disclosure (hereinafter, referred to as embodiments) will be described below. The description is made in the following order:
1. First embodiment (an example in which a plurality of pages are continuously written)
2. Second embodiment (an example in which write conditions are changed)
3. Third embodiment (an example in which verification address information is used)
4. Fourth embodiment (an example in which writing of a plurality of pages and verification are continuously performed)
5. Fifth embodiment (an example of application to a data backup apparatus)

1. First Embodiment

Figure 1:
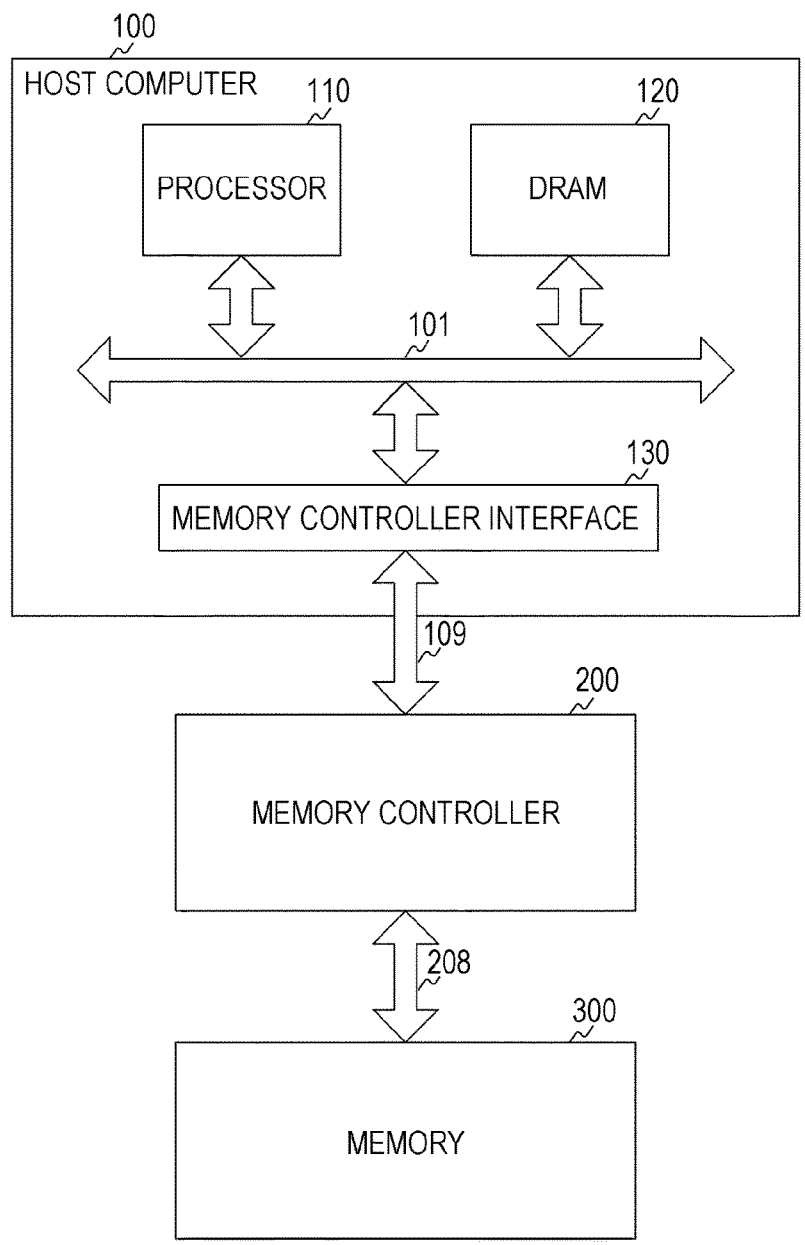
FIG. 1 is a diagram showing an exemplary configuration of an information processing system of a first embodiment of the present technology.

[Configuration of an Information Processing System]
FIG. 1 is a diagram showing an exemplary configuration of an information processing system of a first embodiment of the present technology. The information processing system in the drawing includes a host computer 100, a memory controller 200, a memory 300, and signal lines 109 and 208. Note that the memory 300 is an example of a nonvolatile memory recited in the claims.

The host computer 100 performs input and output of data with the memory 300 through the memory controller 200. The host computer 100 includes a processor 110, a DRAM 120, a memory controller interface 130, and a bus apparatus 101. The processor 110 controls the overall operation of the host computer 100. The DRAM 120 temporarily stores data which is used by the host computer 100. The memory controller interface 130 is an interface that interacts with the memory controller 200. The bus apparatus 101 connects the processor 110, the DRAM 120, and the memory controller interface 130 with each other. The host computer 100 issues commands to the memory controller 200 through the signal line 109, by which input and output of data are performed between the memory controller 200 and the memory 300.

Figure 2:
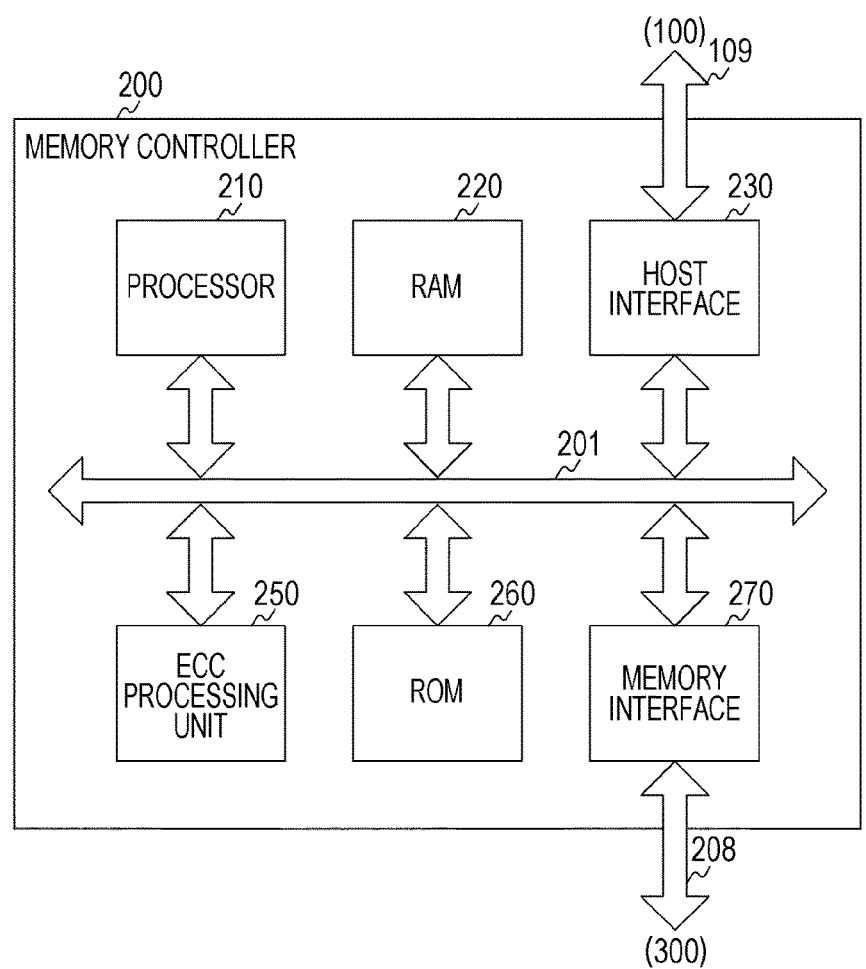
FIG. 2 is a diagram showing an exemplary configuration of a memory controller of the first embodiment of the present technology.

[Configuration of the Memory Controller]
FIG. 2 is a diagram showing an exemplary configuration of the memory controller of the first embodiment of the present technology. The memory controller 200 in the drawing includes a processor 210, a RAM 220, a host interface 230, an ECC processing unit 250, a ROM 260, a memory interface 270, and a bus apparatus 201.

The processor 210 controls the overall operation of the memory controller 200. In addition, the processor 210 also interprets a command issued by the host computer 100 and performs processes based on the command. The RAM 220 temporarily stores data which is used by the memory controller 200. The host interface 230 is an interface that interacts with the host computer 100. The ECC processing unit 250 performs encoding where parity is added to data outputted from the host computer 100 to generate ECC codes; and decoding where original data is taken out of ECC codes. Upon this decoding, data error correction is performed.

The ROM 260 stores firmware of the memory controller 200. The processor 210 operates according to the firmware. The memory interface 270 is an interface that interacts with the memory 300. The bus apparatus 201 connects the above-described units in the memory controller 200 with each other. The memory controller 200 issues requests to the memory 300 through the signal line 208, and performs input and output of data, i.e., writing and reading of data.

Figure 3:
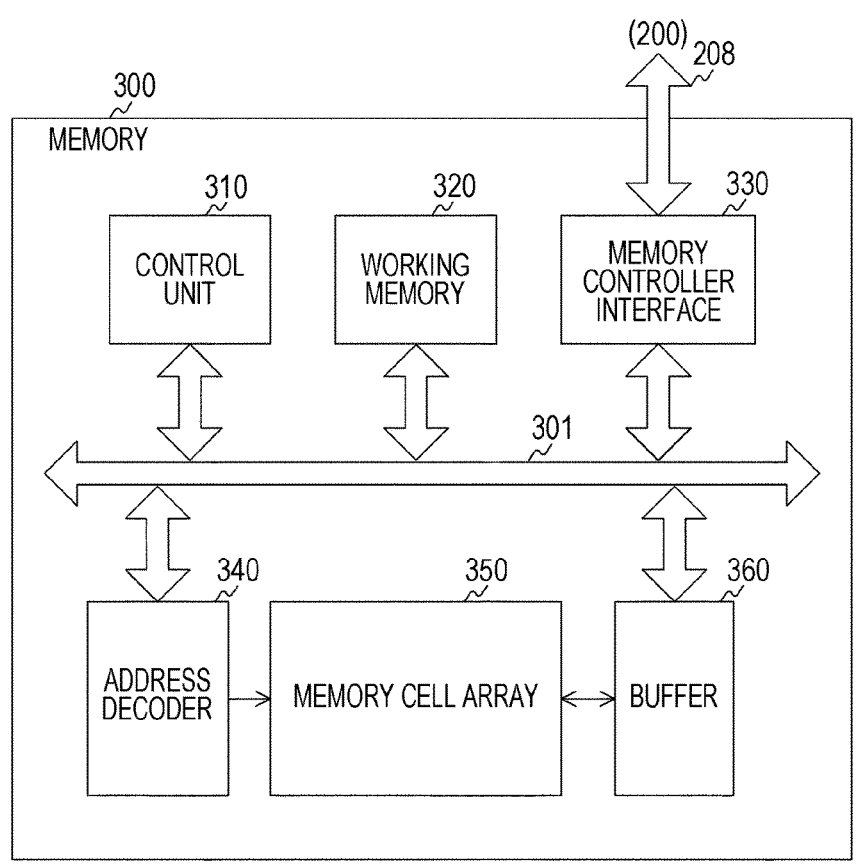
FIG. 3 is a diagram showing an exemplary configuration of a memory of the first embodiment of the present technology.

[Configuration of the Memory]
FIG. 3 is a diagram showing an exemplary configuration of the memory of the first embodiment of the present technology. The memory 300 in the drawing includes a control unit 310, a working memory 320, a memory controller interface 330, an address decoder 340, a memory cell array 350, a buffer 360, and a bus apparatus 301.

The control unit 310 controls the overall operation of the memory 300. In addition, the control unit 310 also interprets a request issued by the memory controller 200 and performs processes based on the request. The working memory 320 temporarily stores data which is used by the memory 300. The memory controller interface 330 is an interface that interacts with the memory controller 200. The memory cell array 350 stores data. The memory cell array 350 is configured such that memory cells composed of a nonvolatile memory are arranged two-dimensionally. The memory cells are accessed on a page-by-page basis, using a page address. The page is, for example, 512 bytes in size.

The address decoder 340 converts a page address provided thereto into a page selection signal and outputs the page selection signal to the memory cell array 350. The buffer 360 holds data to be inputted and outputted to/from the memory cell array 350. The buffer 360 has the same capacity as data of a size corresponding to one page (hereinafter, referred to as page data).

For a nonvolatile memory of the embodiments of the present technology, a nonvolatile memory composed of memory cells having an unstable state period after writing data can be used. Such nonvolatile memory corresponds to, for example, a PCRAM and a ReRAM. In the following description, the description is made using the ReRAM as an example.

[Writing Process of the Information Processing System]

Exchange of data in a writing process of the information processing system of the first embodiment of the present technology will be described using an example case in which the host computer 100 writes data stored in the DRAM 120 into the memory 300. First, the host computer 100 generates a write command and issues the write command to the memory controller 200. The command includes the starting address of write data in the DRAM 120; write data size (the number of pages); and a write address (page address) in the memory 300. The issued command is inputted to the memory controller 200 through the memory controller interface 130 and the host interface 230, and stored in the RAM 220. The processor 210 interprets the command and writes data. First, write data is read from the DRAM 120 on the basis of the command, and stored in the RAM 220. Then, the processor 210 instructs the ECC processing unit 250 to encode the read write data. Thereafter, the processor 210 generates a write request and issues the write request to the memory 300. At that time, the encoded write data is outputted to the memory 300. Finally, it is verified whether writing of the data has succeeded.

This verification is also performed by the memory controller 200 issuing a verification request to the memory 300. If, as a result of the verification, the writing has not succeeded, a request is issued again to perform rewriting. These requests and write data are inputted to the memory 300 through the memory interface 270 and the memory controller interface 330, and stored in the working memory 320. Thereafter, the control unit 310 interprets the requests and performs processes. Note that in the first embodiment of the present technology, instead of individually issuing a verification request and a write request based on the verification request, a verification/write request where those requests are integrated is issued to simplify processes.

[Functional Configuration]

Figure 4:
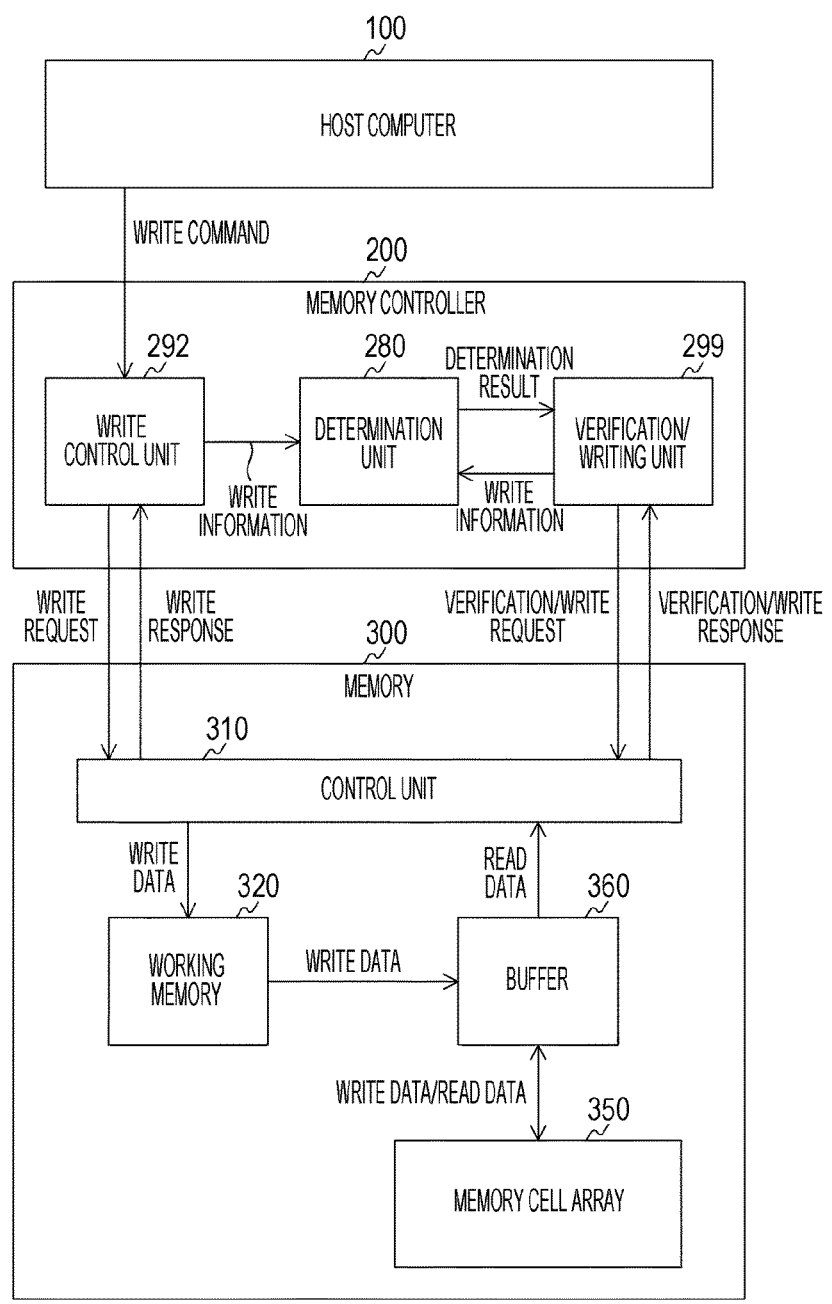
FIG. 4 is a diagram showing an exemplary functional configuration of the first embodiment of the present technology.

FIG. 4 is a diagram showing an exemplary functional configuration of the first embodiment of the present technology. The drawing assumes a functional configuration for writing of data. The memory controller 200 includes a write control unit 292, a determination unit 280, and a verification/writing unit 299. These functions are implemented by the firmware executed by the processor 210 which is described in FIG. 2. Note that the write control unit 292 is an example of a write control unit recited in the claims.

The determination unit 280 determines whether the state of memory cells after writing data is stable in the nonvolatile memory. As described previously, the ReRAM has a period where the state of memory cells is unstable immediately after writing data. The determination unit 280 determines whether the state of the memory cells is stabilized so that reading of data for verification can be performed stably.

The verification/writing unit 299 verifies the writing of the data on the basis of a result of the determination made by the determination unit 280. Here, the verification is to check whether the writing of data has been performed normally. The verification is performed by comparing read data which is read, after writing data, from memory cells where the data is written with write data involved in the writing. In addition, the verification/writing unit 299 further performs rewriting of the write data based on a result of the verification. Namely, the verification/writing unit 299 performs verification and rewriting based on a result of the verification. The verification/writing unit 299 performs verification and rewriting by issuing the aforementioned verification/write request to the memory 300.

The write control unit 292 writes data. The write control unit 292 issues the aforementioned write request to the memory 300. In addition, the write control unit 292 also outputs write information which is required for the above-described determination, to the determination unit 280. The write information and the operation of the determination unit 280 will be described later.

Note that the memory 300 in the drawing includes the control unit 310, the working memory 320, the buffer 360, and the memory cell array 350. They are similar to those described in FIG. 3 and thus description thereof is omitted. Processes performed by such a memory controller 200 and a memory 300 will be described. When a write command is issued to the memory controller 200 from the host computer 100, the write control unit 292 issues a write request to the memory 300. The write request is composed of, for example, an opcode indicating write, write data, and a write destination page address. The control unit 310 interprets the request and stores the write data and write destination page address included in the request in the working memory 320. Then, the control unit 310 transfers the write data to the buffer 360 and allows the buffer 360 to hold the write data. Then, the write data held in the buffer 360 is written into the memory cell array 350. A detail of write operation of the memory cell array 350 will be described later. When the write operation is completed, the control unit 310 outputs, as a write response, the number of written pages which is the number of pages where writing has been performed, to the write control unit 292.

In addition, the write control unit 292 outputs write information based on the write response which is outputted from the memory 300, to the determination unit 280. Namely, the write control unit 292 outputs, as write information, the number of written pages every time write operation is completed.

The determination unit 280 makes the above-described determination on the basis of the write information, and outputs a determination result to the verification/writing unit 299. The verification/writing unit 299 performs verification on the basis of the determination result. Specifically, the verification is performed in the following steps. First, the verification/writing unit 299 reads write data of a page where verification is to be performed, from the DRAM 120 of the host computer 100 and stores the write data in the RAM 220. The write data is used as comparison data for verification. Then, the verification/writing unit 299 generates a verification/write request and issues the verification/write request to the memory 300. The verification/write request is composed of, for example, an opcode indicating verification/write, the comparison data, and a verification destination page address. The verification destination page address is a page address of a page where verification is to be performed, and is the same page address as the above-described write destination page address of the write data. Note that, in the first embodiment of the present technology, both the write data and the comparison data which are included in the write and verification/write requests are composed of page data.

The control unit 310 interprets the request and stores the comparison data and verification destination page address included in the request in the working memory 320. Then, the control unit 310 performs reading on the memory cell array 350 on the basis of the verification destination page address. The read data is held as read data in the buffer 360.

Then, the control unit 310 compares the comparison data stored in the working memory 320 with the read data held in the buffer 360. The comparison is made by determining whether both data completely match. Alternatively, the comparison may be made by determining whether the number of mismatch bits is less than or equal to a predetermined threshold value. This is because even if both data do not completely match, errors are corrected by the ECC processing unit 250 included in the memory controller 200, and thus, desired data can be read.

Then, when the control unit 310 determines, as a result of the above-described comparison, that the comparison data does not match the read data, the control unit 310 rewrites the write data. The rewriting is performed by writing the comparison data stored in the working memory 320 into the memory cell array 350. Thereafter, the control unit 310 outputs, as a verification/write response, the number of pages where writing in the rewriting has been performed to the verification/writing unit 299, and ends the process.

In addition, the verification/writing unit 299 outputs write information based on the verification/write response which is outputted from the memory 300, to the determination unit 280.

[Configuration of the Determination Unit]

Figure 5:
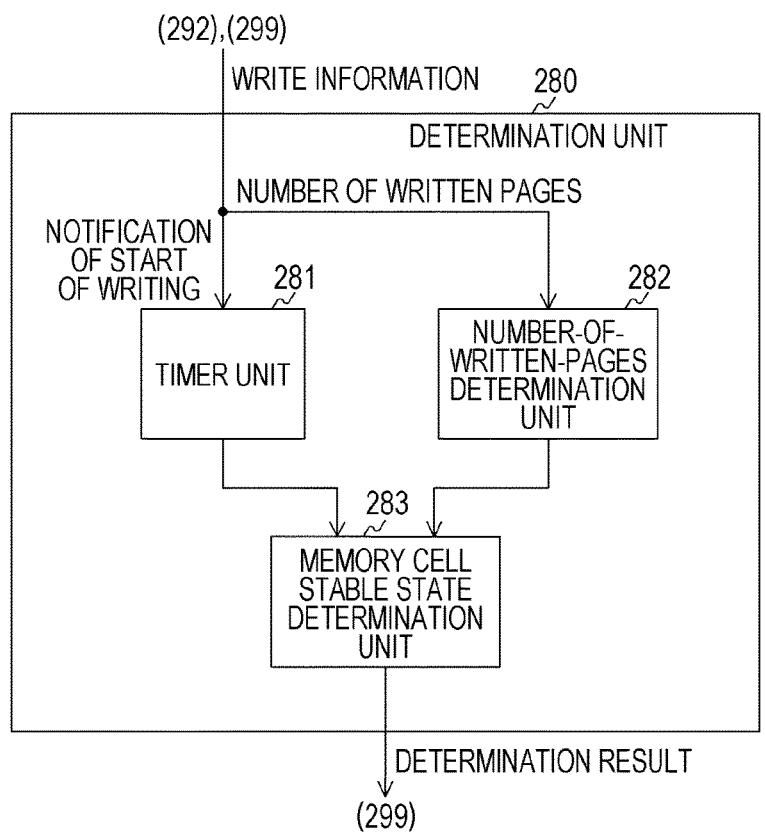
FIG. 5 is a diagram showing an exemplary configuration of a determination unit of the first embodiment of the present technology.

FIG. 5 is a diagram showing an exemplary configuration of the determination unit of the first embodiment of the present technology. The determination unit 280 in the drawing includes a timer unit 281, a number-of-written-pages determination unit 282, and a memory cell stable state determination unit 283.

The timer unit 281 keeps stabilization time after writing of data which is performed by the write control unit 292 and the verification/writing unit 299. Here, the stabilization time is the time taken for the state of memory cells in the nonvolatile memory that have been unstable after writing data to be stabilized. When write information is inputted to the timer unit 281, the timer unit 281 newly starts keeping time, and when the stabilization time has elapsed, the timer unit 281 outputs the result.

The number-of-written-pages determination unit 282 determines whether the number of written pages is greater than or equal to the number of pages with a stabilized state. Here, the number of pages with a stabilized state is the number of pages where write time is reached when write data of a plurality of pages is written, the write time corresponding to stabilization time after writing data in the nonvolatile memory. When write data of a plurality of pages is continuously written, depending on the number of pages written, stabilization time may has elapsed in memory cells where the writing is performed at an early stage during the writing process. In such a case, it can be determined that the state of memory cells involved in the writing is stable, without keeping stabilization time by the timer unit 281 which is described above. This is because by performing verification in order in which writing is performed, a lapse of stabilization time can be assured for all memory cells involved in the writing. The number-of-written-pages determination unit 282 can be configured, for example, to include a counter that counts the number of written pages based on write information. When the count value becomes greater than or equal to the number of pages with a stabilized state, the number-of-written-pages determination unit 282 outputs the result.

The memory cell stable state determination unit 283 determines a stable state of memory cells on the basis of the outputs from the timer unit 281 and the number-of-written-pages determination unit 282. Specifically, when a lapse of stabilization time after writing data in the timer unit 281 or writing of pages greater than or equal to the number of pages with a stabilized state in the number-of-written-pages determination unit 282 takes place, it is determined that the state of memory cells involved in these writing is stabilized. Thereafter, the determination result is outputted. By this, after writing data of a plurality of pages, the determination unit 280 can make a determination on the basis of the number of pages of the write data, and when the number of pages of the write data is smaller than the number of pages with a stabilized state, the determination unit 280 can make the above-described determination on the basis of a lapse of stabilization time.

[Write Operation in the Memory Cell Array]

FIG. 6 is a diagram describing a write operation of the first embodiment of the present technology. With reference to the drawing, a write operation in the memory cell array 350 of the memory 300 will be described. As described previously, in the ReRAM, writing is performed by performing a reset operation and a set operation on a memory cell. Here, the case of a storage element in the ReRAM being in a low-resistance state corresponds to the value "1", and the case of the storage element being in a high-resistance state corresponds to the value "0". By this, the value "0" is written into the memory cell by a reset operation, and the value "1" is written into the memory cell by a set operation.

Note that a reset operation and a set operation of the embodiments of the present technology are performed on the basis of reset operation data and set operation data, respectively. The reset operation data is data where a target bit in page data, i.e., a bit where the value "0" is to be written, has the value "1" and other bits have the value "0". In addition, the set operation data is data where a target bit in page data, i.e., a bit where the value "1" is to be written, has the value "1" and other bits have the value "0". Upon writing data, the memory 300 generates these reset operation data and set operation data and performs a reset operation and a set operation.

Note that pre-erasing may be performed before a data write operation. Here, the pre-erasing is the operation of setting all bits of target memory cells to the value "1", which is performed prior to the writing of data. Unlike a NAND type flash memory, the ReRAM can write data without performing pre-erasing. However, there may be a case in which in order to have compatibility with a NAND type flash memory, the information processing system has a pre-erasing function and performs pre-erasing before a data writing process. Note, however, that in this case, the memory 300 needs to grasp whether pre-erasing of memory cells which are targets of a writing process is performed. This is because a write operation in the memory 300 varies depending on whether pre-erasing is performed. Hence, the memory 300 can use, for example, a scheme in which a flag is provided to the working memory 320 and whether to perform pre-erasing is set to the flag. Next, write and rewrite operations will be described for different cases.

(a) Case of a Write Operation (with Pre-Erasing)

Since all data in memory cells have the value "1" by pre-erasing, the memory 300 performs only a reset operation. Reset operation data is calculated by performing bit-by-bit logic reversal computation on write data. The computation is represented by the following logical expression:

$$RData = \sim W \qquad \text{expression 1}$$

Note that RData represents reset operation data. W represents write data (page data). ~ is the operator representing a bit-by-bit logic reversal. "a" of the drawing shows a relationship between write data, data in memory cells, and reset operation data.

(b) Case of a Write Operation (with No Pre-Erasing)

The memory 300 performs a reset operation and a set operation. Reset operation data is calculated in the following steps. First, data written into memory cells are read. Then, bit-by-bit exclusive-OR computation is performed on the read data and write data. Finally, bit-by-bit AND computation is performed on results of the exclusive-OR computation and the read data. The memory 300 uses the obtained computation results as reset operation data. These computations are represented by the following logical expression:

$$RData=((W\char`\^R)\&R) \quad \text{expression 2}$$

Note that R represents read data (page data). Note also that ^ and & are the operators representing bit-by-bit exclusive-OR computation and bit-by-bit AND computation, respectively.

Set operation data is calculated in the following steps. First, data written into memory cells are read. Then, bit-by-bit exclusive-OR computation is performed on the read data and write data. Finally, bit-by-bit AND computation is performed on results of the exclusive-OR computation and the write data. The memory 300 uses the obtained computation results as set operation data. These computations are represented by the following logical expression:

$$SData=((W\char`\^R)\&W) \quad \text{expression 3}$$

Note that SData represents set operation data. "b" of the drawing shows a relationship between write data, read data, reset operation data, and set operation data.

(c) Case of a Rewrite Operation (with Pre-Erasing)

The memory 300 performs only a reset operation. Reset operation data is calculated on the basis of expression 2.

(d) Case of a Rewrite Operation (with No Pre-Erasing)

In this case, the same operations as those for (b) can be performed. Namely, the memory 300 performs a reset operation and a set operation. Reset operation data and set operation data are calculated on the basis of expression 2 and expression 3, respectively.

[Processing Steps of a Writing Process (Processes on the Memory Controller Side)]

Figure 7:
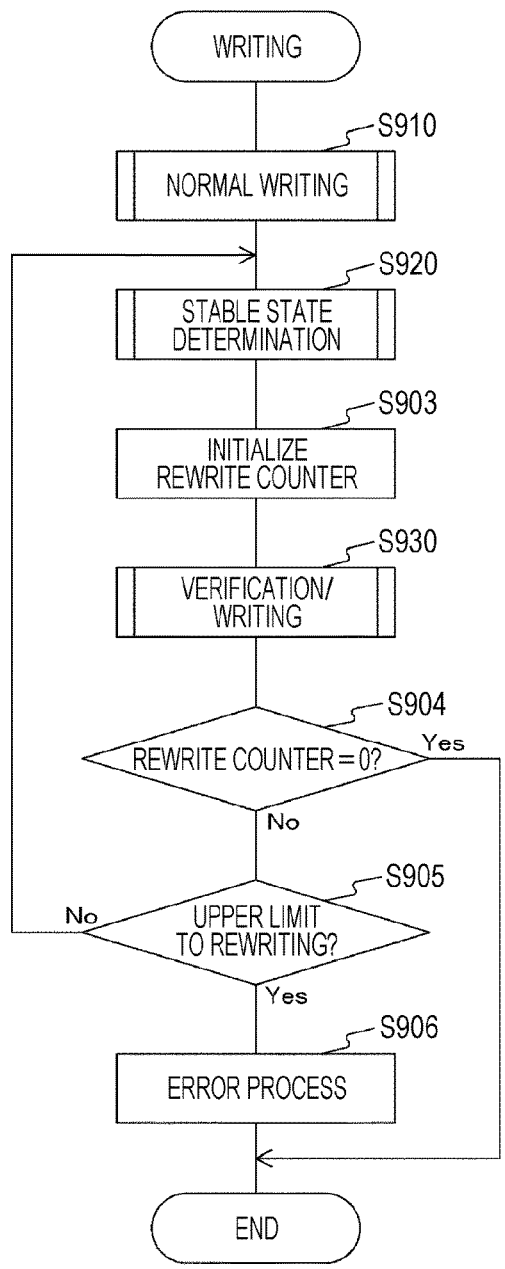
FIG. 7 is a diagram showing an example of the processing steps of a writing process (memory controller) of the first embodiment of the present technology.

FIG. 7 is a diagram showing an example of the processing steps of a writing process (memory controller) of the first embodiment of the present technology. Note that a writing process of the first embodiment of the present technology uses a rewrite counter and an offset register. They are a counter and a register implemented by software in the memory controller 200. The rewrite counter holds the number of rewrites performed in a writing process. The offset register holds an offset value from the starting address of write data in the DRAM 120. Note that the offset value is a value in units of the number of pages.

When a write command is issued by the host computer 100, the memory controller 200 starts a writing process. First, the memory controller 200 performs normal writing (step S910). In the first embodiment of the present technology, write data of a plurality of pages is written in the normal writing process. Then, the memory controller 200 performs a stable state determination process (step S920). Then, the memory controller 200 initializes the rewrite counter (step S903) and performs verification/writing (step S930). By the verification/writing process, the number of rewrites performed is held in the rewrite counter.

If the value of the rewrite counter is "0" (step S904: Yes), it indicates that rewriting has not occurred in the verification/writing process. Namely, it indicates that the writing process has succeeded, and thus, the memory controller 200 notifies the host computer 100 of the fact that the writing process has been completed normally, and ends the writing process. On the other hand, if the value of the rewrite counter is not "0" (step S904: No), it indicates that rewriting has occurred in the verification/writing process. Namely, it indicates that a verification/writing process needs to be performed again on a corresponding portion. In this case, a rewriting process (a process starting from step S920) is performed in a loop until the value of the rewrite counter becomes "0". However, if the number of rewriting processes has reached its upper limit (step S905: Yes), the memory controller 200 performs an error process (step S906) without performing a rewriting process. In the error process, the memory controller 200 notifies the host computer 100 of the fact that the writing of data has been completed abnormally. Thereafter, the memory controller 200 ends the writing process. The upper limit value of a rewriting process can be set to, for example, two.

[Processing Steps of a Normal Writing Process (Processes on the Memory Controller Side)]

Figure 8:
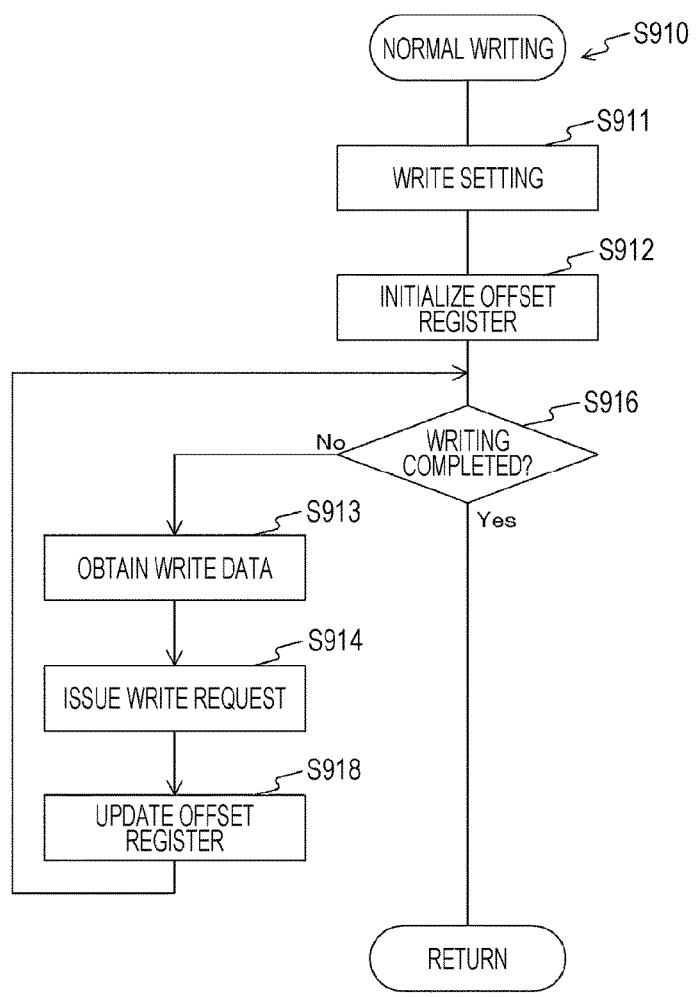
FIG. 8 is a diagram showing an example of the processing steps of a normal writing process (memory controller) of the first embodiment of the present technology.

FIG. 8 is a diagram showing an example of the processing steps of a normal writing process (memory controller) of the first embodiment of the present technology. This process is a process corresponding to step S910 described in FIG. 7. First, the memory controller 200 performs write setting (step S911). Specifically, the starting address of write data in the DRAM 120 which is a read source of the write data, the number of pages of the write data, and a page address in the memory 300 which is a write destination are set on the basis of a write command. Then, the memory controller 200 initializes the offset register (step S912). Thereafter, the memory controller 200 checks whether writing of all data has been completed (step S916). Specifically, the memory controller 200 performs the check by comparing the number of pages of the write data set at step S911 with the number of pages where writing has been completed, e.g., the value of the offset register.

If, as a result, writing of all data has been completed (step S916: Yes), the normal writing process ends. On the other hand, if writing of all data has not been completed (step S916: No), processing transitions to a process starting from step S913. The memory controller 200 obtains write data from the host computer 100 (step S913). Specifically, the memory controller interface 130 is instructed to transfer write data through the host interface 230. At this time, an address in the DRAM 120 which is a read source of the data is specified. The address is obtained by adding the product of the value of the offset register and page size to the starting address of write data in the DRAM 120. The memory controller interface 130 reads page data at the specified address from the DRAM 120, and outputs the page data as write data to the memory controller 200.

The memory controller 200 stores the page data in the RAM 220. The ECC processing unit 250 performs encoding on the page data. Then, the memory controller 200 generates and issues a write request including the encoded page data (step S914). At this time, for a write destination page address in the write request, a value can be used that is obtained by adding the value of the offset register to the write address (page address) in the memory 300 which is included in the write command outputted from the host computer 100. Namely, the page address can be specified by a relative address in relation to the value of the offset register. After write operation in the memory 300 is completed and a write response is outputted from the memory 300, the memory controller 200 updates the offset register (step S918) and returns to the process at step S916. Note that the memory controller 200 outputs write information based on the write response, to the determination unit 280 when the process at step S914 is performed. By this, keeping of stabilization time by the timer unit 281 and a determination according to the number of pages with a stabilized state by the number-of-written-pages determination unit 282 can start.

[Processing Steps of a Stable State Determination Process (Processes on the Memory Controller Side)]

Figure 9:
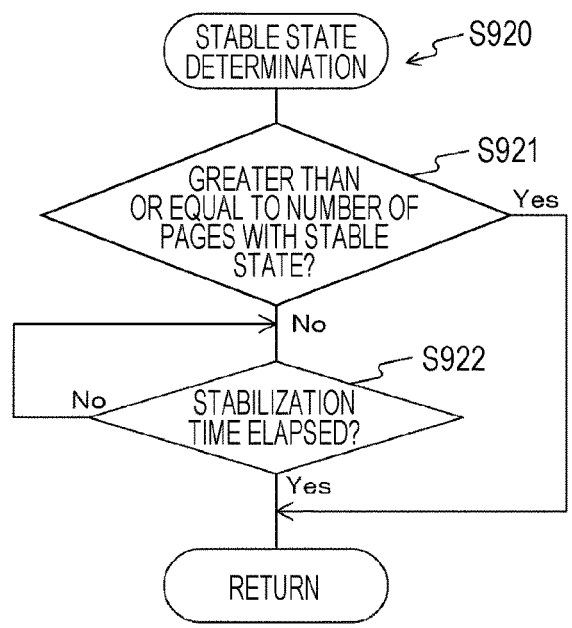
FIG. 9 is a diagram showing an example of the processing steps of a stable state determination process (memory controller) of the first embodiment of the present technology.

FIG. 9 is a diagram showing an example of the processing steps of a stable state determination process (memory controller) of the first embodiment of the present technology. This process is a process corresponding to step S920 described in FIG. 7. First, the memory controller 200 determines whether the number of written pages is greater than or equal to the number of pages with a stabilized state (step S921). If, as a result, the number of written pages is greater than or equal to the number of pages with a stabilized state (step S921: Yes), the stable state determination process ends. On the other hand, if the number of written pages is less than the number of pages with a stabilized state (step S921: No), the memory controller 200 determines whether stabilization time has elapsed (step S922), and waits until the stabilization time has elapsed (step S922: No). On the other hand, if the stabilization time has elapsed (step S922: Yes), the stable state determination process ends. Note that when the memory controller 200 performs the process at step S921, the memory controller 200 resets the counter of the number-of-written-pages determination unit 282 to set the number of written pages held therein to zero.

[Processing Steps of a Verification/Writing Process (Processes on the Memory Controller Side)]

Figure 10:
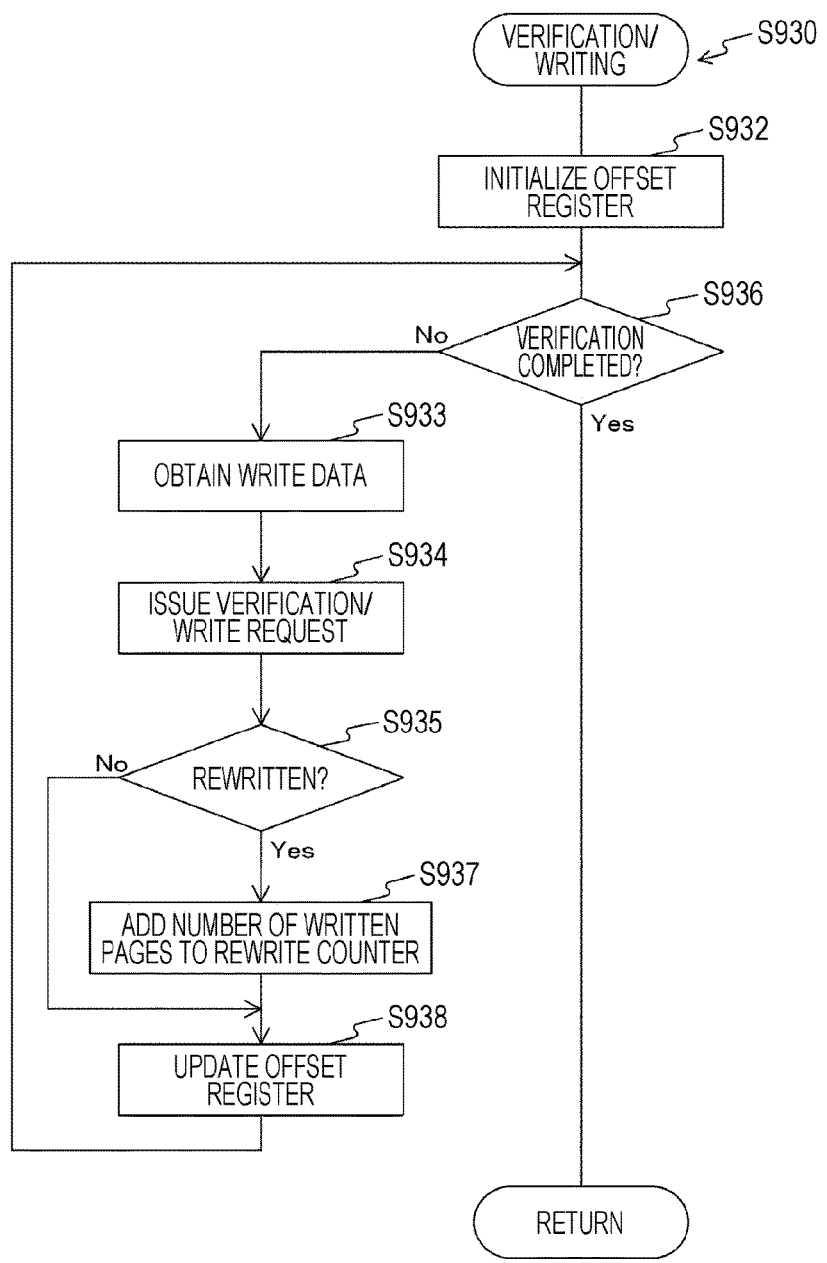
FIG. 10 is a diagram showing an example of the processing steps of a verification/writing process (memory controller) of the first embodiment of the present technology.

FIG. 10 is a diagram showing an example of the processing steps of a verification/writing process (memory controller) of the first embodiment of the present technology. This process is a process corresponding to step S930 described in FIG. 7. First, the memory controller 200 initializes the offset register (step S932). Then, the memory controller 200 checks whether verification of all data has been completed (step S936). If, as a result, verification of all data has been completed (step S936: Yes), the verification/writing process ends. On the other hand, if verification of all data has not been completed (step S936: No), processing transitions to a process starting from step S933.

The memory controller 200 obtains write data from the host computer 100 (step S933). Then, the memory controller 200 generates and issues a verification/write request including the write data (step S934). As a response to the request (verification/write response), the memory 300 outputs the number of written pages in rewriting. If, as a result of the request, rewriting is performed by the memory 300, the memory controller 200 updates the rewrite counter. Namely, if the number of written pages in the verification/write response is not zero (step S935: Yes), the memory controller 200 adds the number of written pages in the verification/write response, to the rewrite counter (step S937). Thereafter, the memory controller 200 transitions to a process at step S938.

On the other hand, if rewriting has not been performed by the memory 300, i.e., if the number of written pages in the verification/write response is zero (step S935: No), the memory controller 200 skips the process at step S937 and transitions to the process at step S938. At step S938, the memory controller 200 updates the offset register (step S938), and returns to the process at step S936. Note that the memory controller 200 outputs write information based on the verification/write response, to the determination unit 280 when the process at step S934 is performed.

[Processing Steps of a Writing Process (Processes on the Memory Side)]

Figure 11:
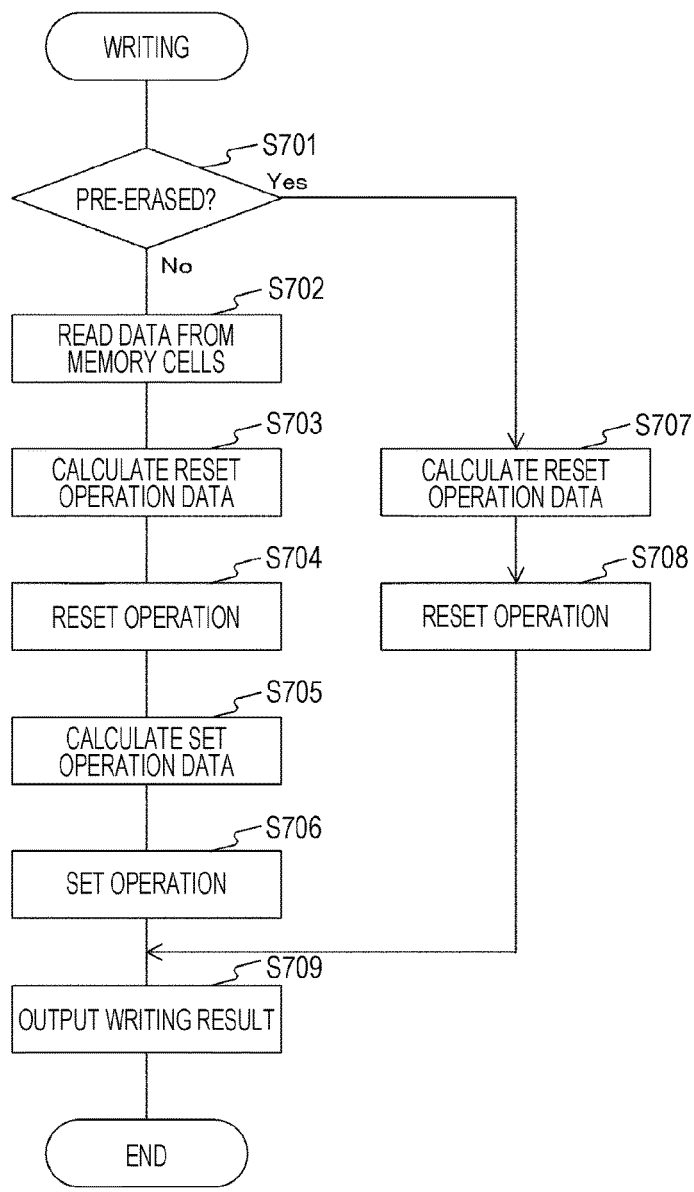
FIG. 11 is a diagram showing an example of the processing steps of a writing process (memory) of the first embodiment of the present technology.

FIG. 11 is a diagram showing an example of the processing steps of a writing process (memory) of the first embodiment of the present technology. When a write request is issued from the memory controller 200, the memory 300 starts a writing process. Note that write data associated with the request is stored in the working memory 320. First, the memory 300 checks whether pre-erasing has been performed (step S701). If pre-erasing has not been performed (step S701: No), the memory 300 performs processes at steps S702 to S706. On the other hand, if pre-erasing has been performed (step S701: Yes), the memory 300 performs processes at steps S707 and S708.

First, the processes at steps S702 to S706 will be described. This case corresponds to the aforementioned (b) case of a write operation (with no pre-erasing). The memory 300 reads page data from memory cells which are targets of a write operation (step S702). The memory 300 calculates reset operation data on the basis of the read page data and the write data stored in the working memory 320 (step S703) and performs a reset operation (step S704). Then, the memory 300 calculates set operation data (step S705), performs a set operation (step S706), and transitions to a process at step S709. Next, the processes at steps S707 and S708 will be described. This case corresponds to the aforementioned (a) case of a write operation (with pre-erasing). Since pre-erasing has been performed, the memory 300 calculates reset operation data without reading page data from memory cells (step S707). Then, the memory 300 performs a reset operation (step S708) and transitions to the process at step S709. At step S709, the memory 300 outputs the number of pages where writing has been performed, as a result of the writing process, to the memory controller 200 (step S709) and ends the writing process.

[Processing Steps of a Verification/Writing Process (Processes on the Memory Side)]

Figure 12:
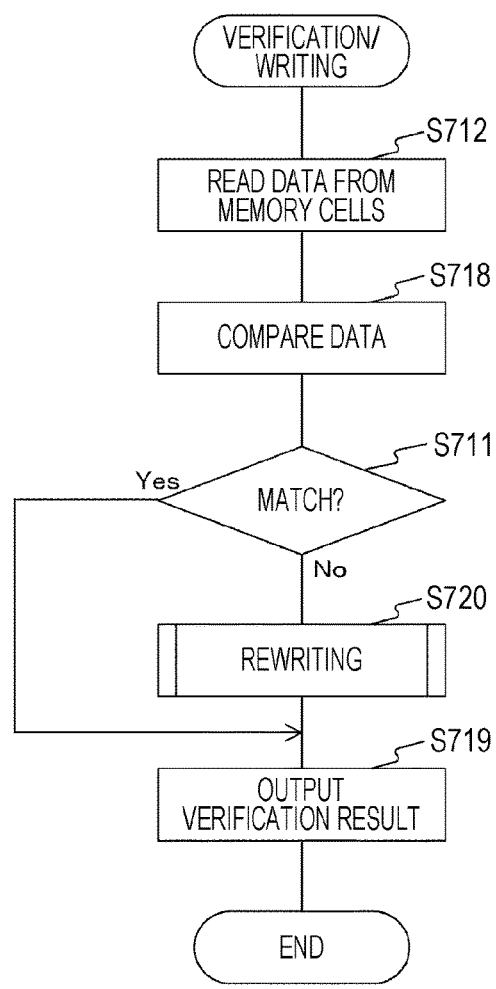
FIG. 12 is a diagram showing an example of the processing steps of a verification/writing process (memory) of the first embodiment of the present technology.

FIG. 12 is a diagram showing an example of the processing steps of a verification/writing process (memory) of the first embodiment of the present technology. When a verification/write request is issued from the memory controller 200, the memory 300 starts a verification/writing process. Note that comparison data associated with the request is stored in the working memory 320. First, the memory 300 reads data (page data) from memory cells (step S712). The read data is held in the buffer 360. Then, the memory 300 compares the data (step S718). Specifically, the memory 300 compares the comparison data stored in the working memory 320 with the data held in the buffer 360.

If, as a result, both data do not match (step S711: No), rewriting is performed (step S720). On the other hand, if both data match (step S711: Yes), the process at step S720 is skipped and processing transitions to a process at step S719. At step S719, the memory 300 outputs the number of pages where writing has been performed, as a result of the verification/writing process, to the memory controller 200 (step S719) and ends the verification/writing process.

[Processing Steps of a Rewriting Process (Processes on the Memory Side)]

Figure 13:
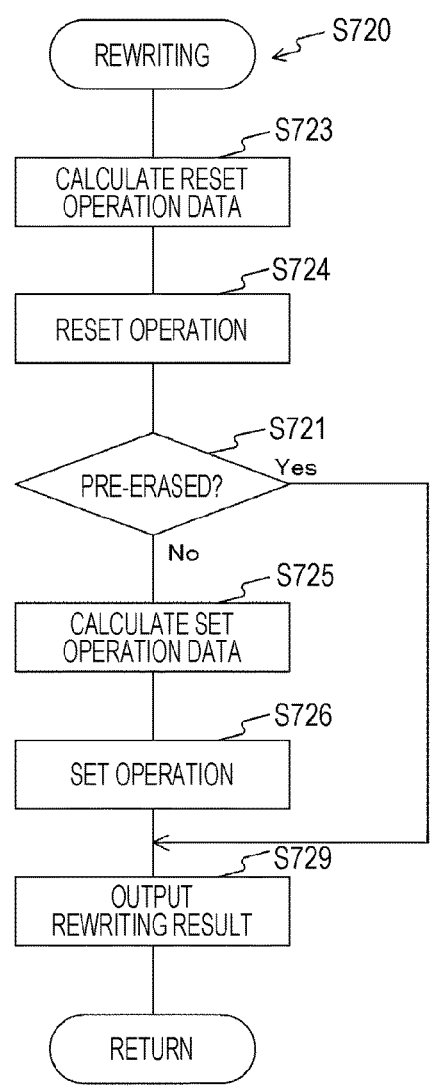
FIG. 13 is a diagram showing an example of the processing steps of a rewriting process (memory) of the first embodiment of the present technology.

FIG. 13 is a diagram showing an example of the processing steps of a rewriting process (memory) of the first embodiment of the present technology. This process is a process corresponding to step S720 described in FIG. 12. Namely, since the process is called from the above-described verification/writing process, the data read from the memory cells is held in the buffer 360. Rewriting is performed using this data. The memory 300 calculates reset operation data (step S723) and performs a reset operation (step S724). In the first embodiment of the present technology, upon rewriting, a reset operation is performed regardless of whether pre-erasing has been performed.

Then, the memory 300 checks whether pre-erasing has been performed (step S721). If pre-erasing has not been performed (step S721: No), the memory 300 performs processes at steps S725 and S726. This case corresponds to the aforementioned (d) case of a rewrite operation (with no pre-erasing). On the other hand, if pre-erasing has been performed (step S721: Yes), the memory 300 transitions to a process at step S729. This case corresponds to the aforementioned (c) case of a rewrite operation (with pre-erasing). The processes at step S725 and S726 will be described. The memory 300 calculates set operation data (step S725), performs a set operation (step S726), and transitions to a process at step S729. At step S729, the memory 300 outputs the number of pages where writing has been performed, as a result of the rewriting process, to the memory controller 200 (step S729) and ends the rewriting process.

As such, according to the first embodiment of the present technology, after writing data of a plurality of pages, it is determined whether the state of memory cells is stable, on the basis of either the number of written pages which is greater than or equal to the number of pages with a stabilized state or a lapse of stabilization time after the writing. After determining that the state of memory cells is stabilized, data is read and verification is performed, by which accurate verification of write data can be performed, and thus, write reliability can be improved.

[First Variant]

In the above-described first embodiment, at step S933 of the verification/writing process described in FIG. 10, data for verification is read and transferred page by page from the DRAM 120 of the host computer 100. However, a plurality of pieces of page data may be transferred all at once. This is because data transfer time can be reduced. Hence, in a first variant, in the verification/writing process, a plurality of pieces of page data are transferred all at once from the DRAM 120. By this, the transferred data of a plurality of pages are stored in the RAM 220 of the memory controller 200, and are read page by page and used for verification upon the verification/write request issuing process (step S934).

[Second Variant]

In the above-described first embodiment, at step S934 of the verification/writing process described in FIG. 10, page data is outputted along with the issue of a verification/write request. However, a plurality of pieces of page data may be outputted all at once and transferred to the memory 300. This is because, as in the first variant, data transfer time can be reduced. Hence, in a second variant, in the verification/writing process, a plurality of pieces of page data are outputted all at once upon issuing a verification/write request. By this, the transferred pieces of page data are stored in the working memory 320 of the memory 300, and are read page by page and used for verification and rewriting upon the verification/writing process in the memory 300.

[Third Variant]

In the above-described first embodiment, the determination unit 280 of FIG. 4 determines whether the state of memory cells is stable, on the basis of either the number of written pages which is greater than or equal to the number of pages with a stabilized state or a lapse of stabilization time after writing. However, the determination may be made on the basis of only a lapse of stabilization time. This is because the configuration of the determination unit 280 can be simplified. Hence, in a third variant, the number-of-written-pages determination unit 282 is omitted and the determination is made on the basis of only a lapse of stabilization time by the timer unit 281.

[Fourth Variant]

In the above-described first embodiment, the determination unit 280 of FIG. 4 determines whether the state of memory cells is stable, on the basis of either the number of written pages which is greater than or equal to the number of pages with a stabilized state or a lapse of stabilization time after writing. However, the determination unit 280 may determine that the state of memory cells is stable, after the write control unit 292 has continuously written data of a plurality of pages and then the verification/writing unit 299 has performed verification in order in which the writing is performed. This is because when, for example, processing takes time due to large page data size, a lapse of predetermined stabilization time can be assured by writing of data of a plurality of pages. Hence, the number-of-written-pages determination unit 282 makes a determination on the basis of whether writing is performed for a plurality of pages. By this, the configuration of the determination unit 280 can be simplified.

[Fifth Variant]

In the above-described first embodiment, in a rewriting process for when pre-erasing has been performed, only a reset operation is performed; however, even when pre-erasing has been performed, rewriting may be performed by a reset operation and a set operation. Even when a write disturb phenomenon occurs due to a reset operation, reversal of data written into memory cells can be prevented by performing a set operation. Note that the write disturb phenomenon is a phenomenon where when writing is performed on a memory cell, data stored in a neighboring memory cell is rewritten. Hence, even when pre-erasing has been performed, rewriting is performed by a reset operation and a set operation. By this, the reliability of writing of data can be improved.

Write and rewrite operations will be described for different cases.

(a') Case of a Write Operation (with Pre-Erasing)

The memory 300 performs only a reset operation. Reset operation data is calculated on the basis of expression 1. Namely, the same operations as those for the aforementioned (a) can be performed.

(b') Case of a Write Operation (with No Pre-Erasing)

The memory 300 performs a reset operation and a set operation. Reset operation data and set operation data are calculated on the basis of expression 2 and expression 3, respectively. Namely, the same operations as those for the aforementioned (b) can be performed.

(c') Case of a Rewrite Operation (with Pre-Erasing)

In this case, the same operations as those for (b') can be performed.

(d') Case of a Rewrite Operation (with No Pre-Erasing)

In this case, too, the same operations as those for (b') can be performed.

[Processing Steps of a Rewriting Process (Processes on the Memory Side)]

Figure 14:
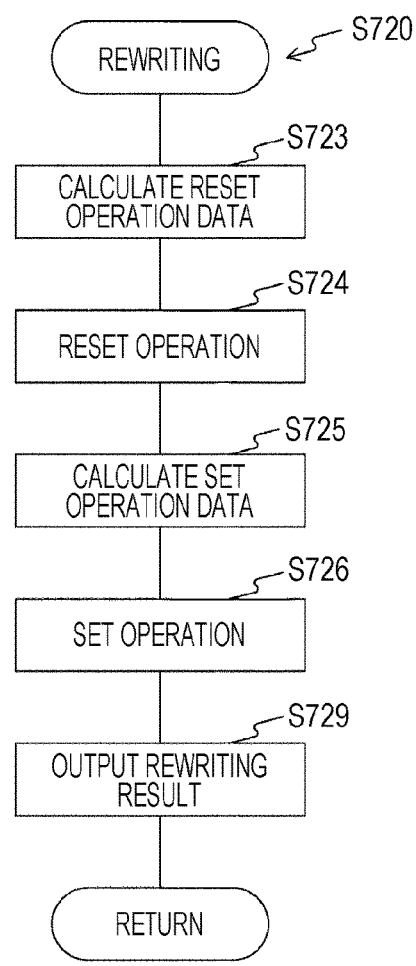
FIG. 14 is a diagram showing an example of the processing steps of a rewriting process (memory) of a variant of the first embodiment of the present technology.

FIG. 14 is a diagram showing an example of the processing steps of a rewriting process (memory) of a variant of the first embodiment of the present technology. In a fifth variant, since a reset operation and a set operation are performed regardless of whether pre-erasing is performed, a process is simplified compared to the rewriting process described in FIG. 13. First, the memory 300 calculates reset operation data (step S723) and performs a reset operation (step S724). Then, the memory 300 calculates set operation data (step S725) and performs a set operation (step S726). Then, the memory 300 outputs the number of pages where writing has been performed, as a result of the rewriting process, to the memory controller 200 (step S729) and ends the rewriting process.

[Sixth Variant]

In the above-described first embodiment, a ReRAM is assumed as a nonvolatile memory; however, a PCRAM in which if reading is performed immediately after writing data, the written data is corrupted may be used. In the PCRAM, too, after writing data of a plurality of pages, it is determined whether the state of memory cells is stable, and verification is performed, by which accurate verification of write data can be performed. By this, write reliability can be improved.

[Processing Steps of a Writing Process and a Rewriting Process (Processes on the Memory Side)]

In the PCRAM, upon writing data, reset operation data and set operation data can be generated without reading data in memory cells. Hence, a process is simplified. Note that in a sixth variant of the first embodiment of the present technology, it is assumed that pre-erasing is not performed. By this, a writing process and a rewriting process become identical processes and have processing steps similar to the processes described in FIG. 14. At step S723, the memory controller 200 calculates reset operation data. This is calculated on the basis of expression 1. At step S725, the memory controller 200 calculates set operation data. This is calculated on the basis of the following expression:

$$SData = W$$

Other processing steps are similar to the processing steps of FIG. 14, and thus, description thereof is omitted. Note that in the PCRAM, too, as with the ReRAM, data in memory cells may be read, and reset operation data and set operation data may be generated by referring to the read data. The generation of reset operation data and set operation data for this case can be performed in a similar manner to the aforementioned generation of these data for the ReRAM.

[Seventh Variant]

In the above-described first embodiment, the memory controller 200 includes the write control unit 292, the determination unit 280, and the verification/writing unit 299; however, the memory 300 may include these units. This is because the processes of the memory controller 200 can be simplified. In this case, the memory controller 200 issues only a write request to the memory 300. Then, the memory 300 performs writing, determination, and verification/writing processes on the basis of the request.

2. Second Embodiment

In the above-described first embodiment, upon rewriting, writing is performed without changing a write voltage to be applied to a storage element, etc. On the other hand, in a second embodiment of the present technology, upon rewriting, write conditions are changed. By this, write reliability is improved.

[Functional Configuration]

Figure 15:
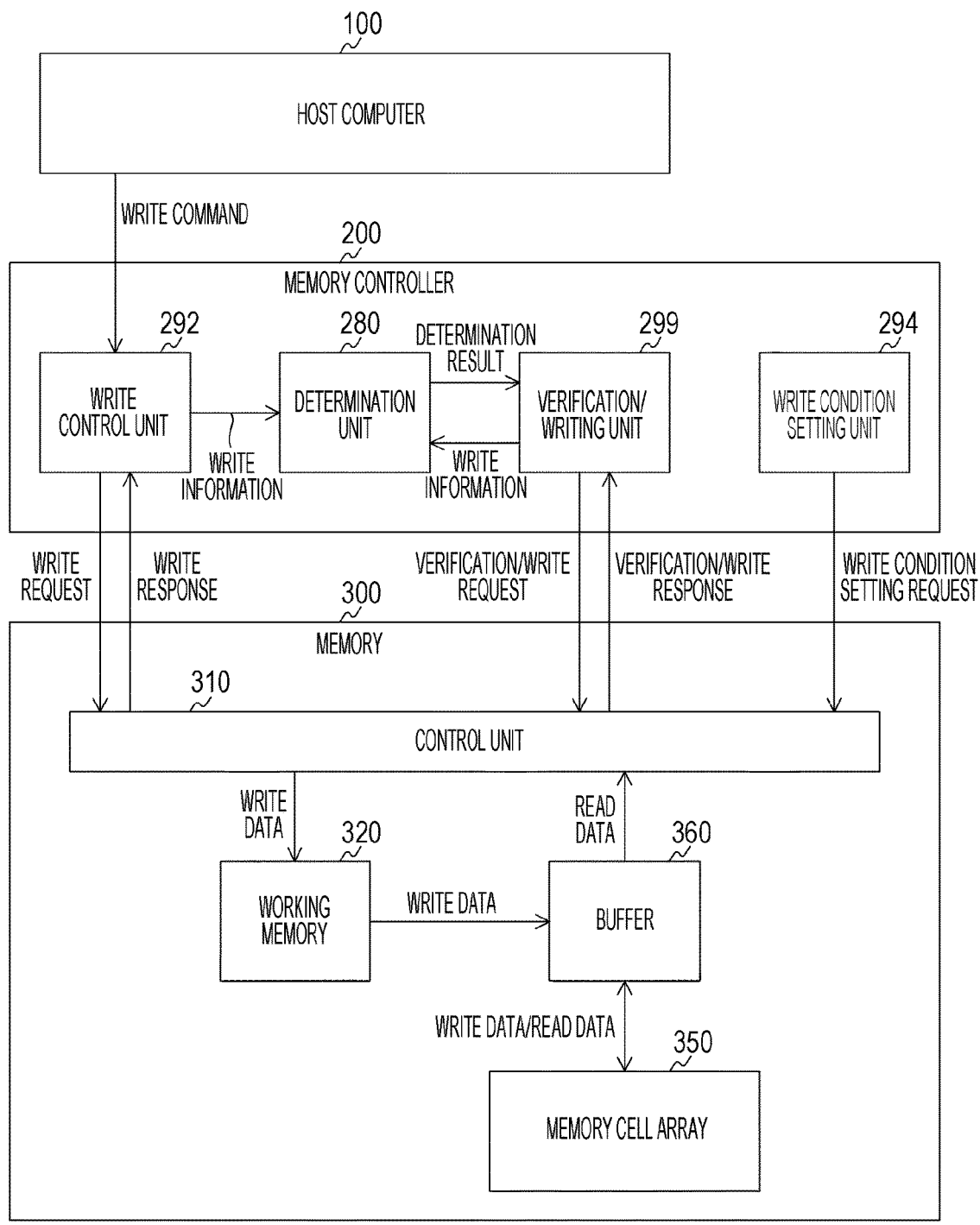
FIG. 15 is a diagram showing an exemplary functional configuration of a second embodiment of the present technology.

FIG. 15 is a diagram showing an exemplary functional configuration of the second embodiment of the present technology. A memory controller 200 in the drawing includes a write condition setting unit 294. The write condition setting unit sets write conditions on a memory 300.

Here, the write conditions are conditions used when data is written into memory cells. The setting of the write conditions is performed by issuing a write condition setting request to the memory 300. The memory 300 holds write conditions based on the write condition setting request and applies the write conditions upon writing. Other configurations are similar to those of the memory controller 200 and the memory 300 which are described in FIG. 4, and thus, description thereof is omitted.

[Write Condition]

Write conditions for a ReRAM include, for example, a write voltage to be applied to a storage element in a memory cell and the pulse width and number of pulses thereof, a current to flow through the memory cell, a read voltage, and a reference voltage used upon reading. The memory controller 200 of the second embodiment of the present technology sets predetermined write conditions on the memory 300 and performs normal writing, and changes the write conditions upon rewriting. For example, rewriting is performed by changing the write voltage.

By increasing the write voltage upon rewriting, the speed of diffusion of metal ions in an insulating layer of the storage element can be increased. Even in a memory cell in which writing has failed because metal ions in the insulating layer have low mobility and thus the resistance value of the storage element becomes a value near a threshold value upon writing, by increasing the write voltage upon rewriting, the storage element can be brought into a desired high-resistance state or low-resistance state. By this, writing succeeds and write reliability can be improved. Note that when the write voltage is increased, power consumption increases. However, in the second embodiment of the present technology, by using a high write voltage only for rewriting, write reliability can be improved while an increase in overall power consumption during a writing process is suppressed.

[Processing Steps of a Writing Process (Processes on the Memory Controller Side)]

Figure 16:
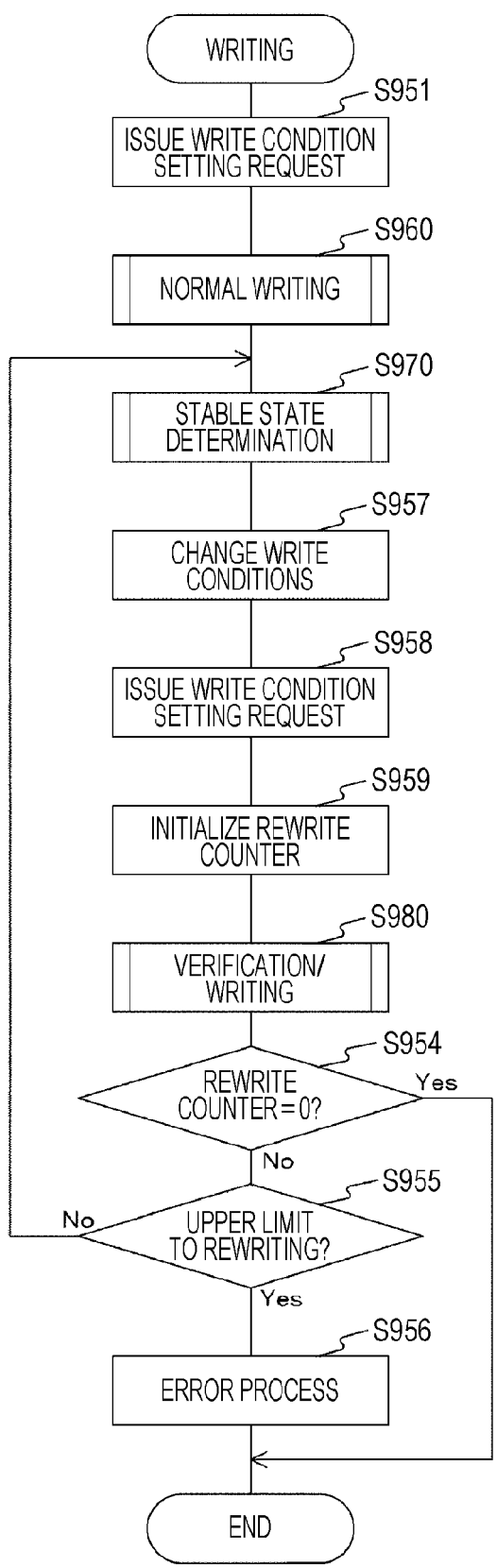
FIG. 16 is a diagram showing an example of the processing steps of a writing process (memory controller) of the second embodiment of the present technology.

FIG. 16 is a diagram showing an example of the processing steps of a writing process (memory controller) of the second embodiment of the present technology. When a write command is issued from a host computer 100, the memory controller 200 starts a writing process. First, the memory controller 200 issues a write condition setting request (step S951). By this, predetermined write conditions are set on the memory 300. Then, the memory controller 200 interprets the command and performs normal writing (step S960). Then, the memory controller 200 performs a stable state determination process (step S970). Thereafter, prior to a subsequent verification/writing process, the memory controller 200 changes the write conditions (step S957), and issues a write condition setting request based on the changed conditions (step S958). Then, the memory controller 200 initializes a rewrite counter (step S959) and performs verification/writing (step S980). Thereafter, if the value of the rewrite counter is "0" (step S954: Yes), the memory controller 200 notifies the host computer 100 of the fact that the writing process has been completed normally, and ends the writing process.

If the value of the rewrite counter is not "0" (step S954: No), a rewriting process (a process starting from step S970) is performed in a loop until the value of the rewrite counter becomes "0" and within a range where the number of rewriting processes does not reach its upper limit (step S955: No). However, if the number of rewriting processes has reached its upper limit at step S955 (step S955: Yes), the memory controller 200 performs an error process (step S956) without performing a rewriting process. In the error process, the memory controller 200 notifies the host computer 100 of the fact that the writing of data has been completed abnormally. Thereafter, the memory controller 200 ends the writing process.

Note that the normal writing (step S960) process is similar to the normal writing (step S910) described in FIG. 7, and thus, description thereof is omitted. The stable state determination (step S970) process is similar to the stable state determination (step S920) described in FIG. 7, and thus, description thereof is omitted. The verification/writing (step S980) process is similar to the verification/writing (step S930) described in FIG. 7, and thus, description thereof is omitted. In addition, the processes of the memory 300 are also similar to the processes of the first embodiment of the present technology, and thus, description thereof is omitted.

As such, according to the second embodiment of the present technology, by changing write conditions used upon rewriting, write reliability can be further increased.

3. Third Embodiment

In the above-described first embodiment, upon rewriting, verification is performed on all memory cells which are targets of a writing process, and thus, long processing time is required. On the other hand, in a third embodiment of the present technology, a page address of a page that requires verification is held and verification is performed, by which unnecessary verification is suppressed, increasing the speed of a writing process.

[Functional Configuration]

Figure 17:
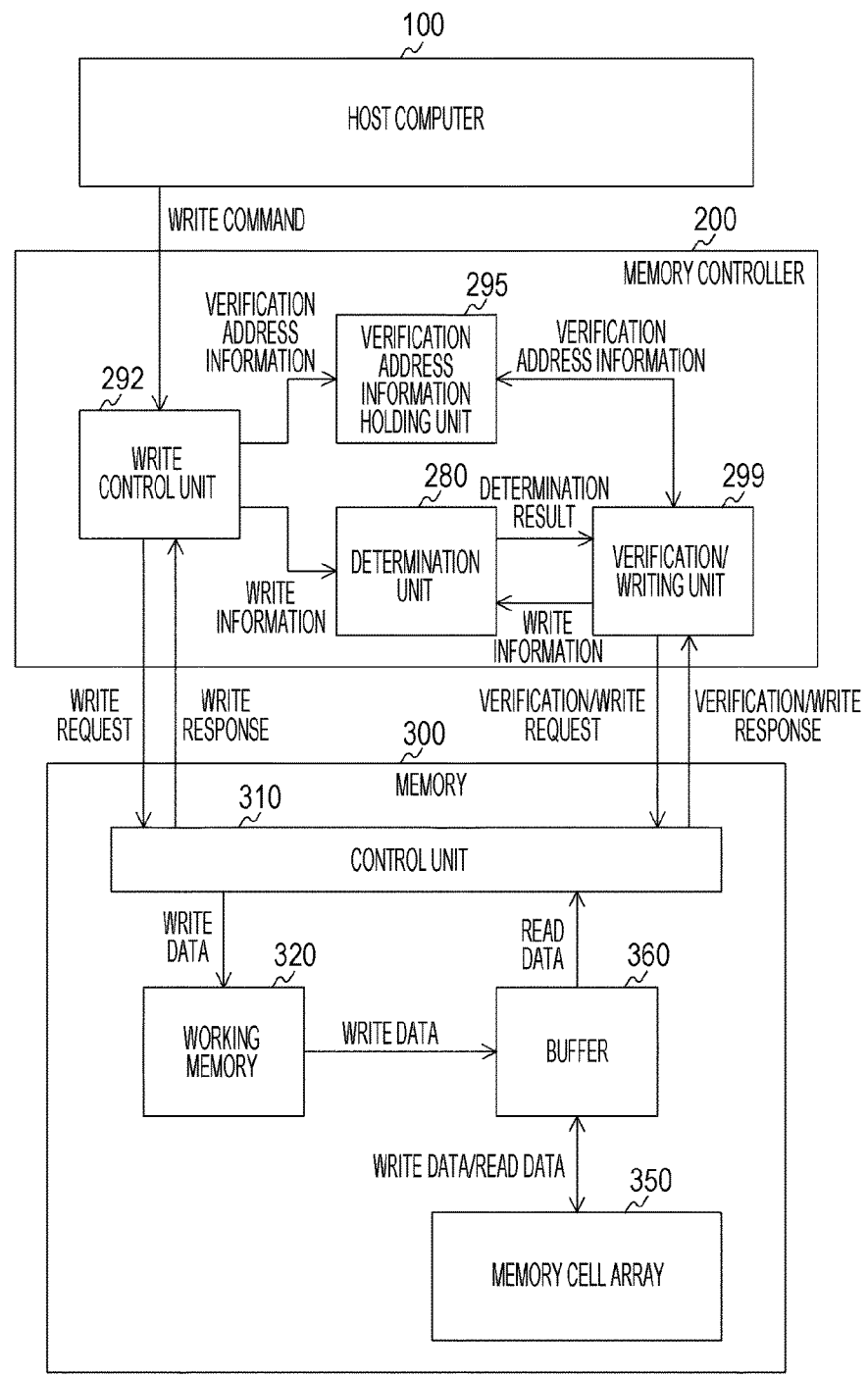
FIG. 17 is a diagram showing an exemplary functional configuration of a third embodiment of the present technology.

FIG. 17 is a diagram showing an exemplary functional configuration of the third embodiment of the present technology. A memory controller 200 in the drawing includes a verification address information holding unit 295. The verification address information holding unit 295 holds verification address information. Here, the verification address information is information on a page address of a page in a memory 300 where verification is to be performed. A write control unit 292 allows the verification address information holding unit 295 to hold, as verification address information, information on a page address where writing has been performed when writing is performed. Likewise, a verification/writing unit 299 allows the verification address information holding unit 295 to hold, as verification address information, information on a page address where rewriting has been performed when rewriting is performed. In addition, the verification/writing unit 299 performs verification on the basis of the verification address information held in the verification address information holding unit 295. Other configurations are similar to those of the memory controller 200 and the memory 300 which are described in FIG. 4, and thus, description thereof is omitted.

[Processing Steps of a Writing Process (Processes on the Memory Controller Side)]

Figure 18:
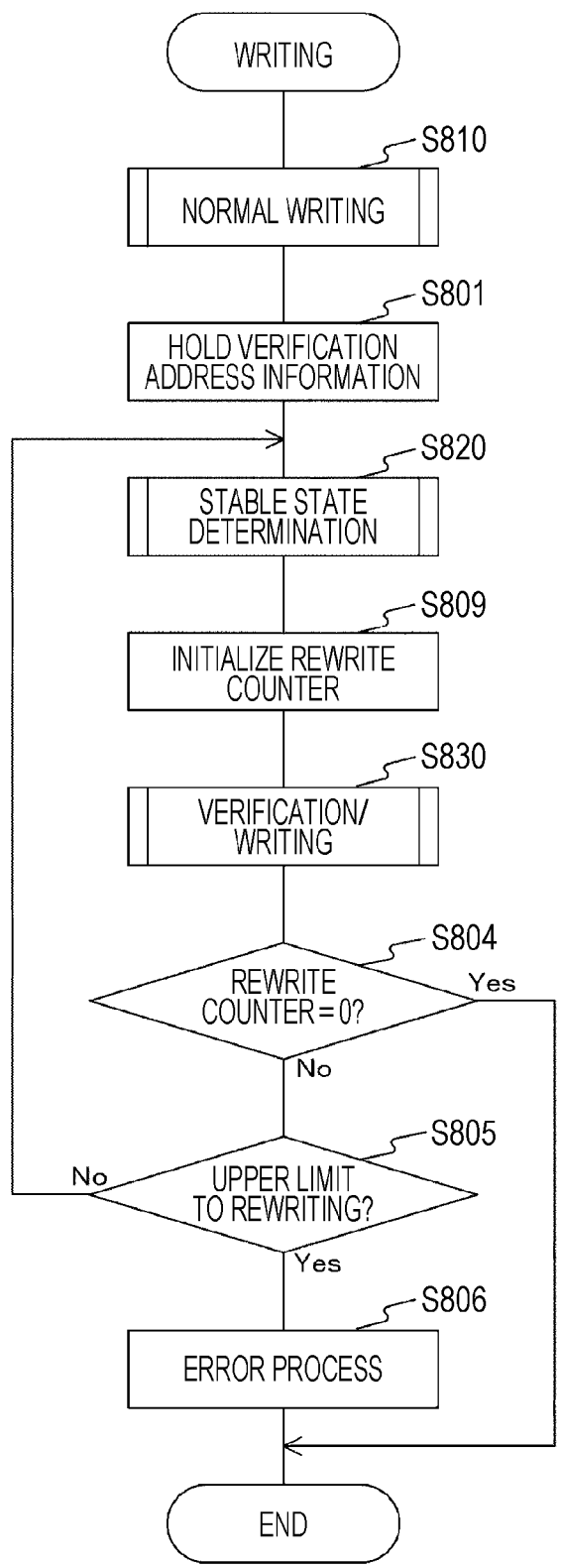
FIG. 18 is a diagram showing an example of the processing steps of a writing process (memory controller) of the third embodiment of the present technology.

FIG. 18 is a diagram showing an example of the processing steps of a writing process (memory controller) of the third embodiment of the present technology. When a write command is issued from a host computer 100, the memory controller 200 starts a writing process. First, the memory controller 200 performs normal writing (step S810). Then, the memory controller 200 holds verification address information (step S801). In this case, the page addresses of all pages which are write targets are held as verification address information in the verification address information holding unit 295. Note that the third embodiment also adopts a scheme for specifying a page address in the memory 300 which is similar to that of the aforementioned first embodiment. Namely, a value obtained by adding the value of an offset register to a write address in the memory 300 which is included in the write command outputted from the host computer 100 is used as a write address (page address) in the memory 300. Hence, as verification address information held in the verification address holding unit 295, the value of the offset register is used.

Then, the memory controller 200 performs a stable state determination process (step S820). Then, the memory controller 200 initializes a rewrite counter (step S809) and performs verification/writing (step S830). Thereafter, if the value of the rewrite counter is "0" (step S804: Yes), the memory controller 200 notifies the host computer 100 of the fact that the writing process has been completed normally, and ends the writing process.

If the value of the rewrite counter is not "0" (step S804: No), a rewriting process (a process starting from step S820) is performed in a loop until the value of the rewrite counter becomes "0" and within a range where the number of rewriting processes does not reach its upper limit (step S805: No). However, if the number of rewriting processes has reached its upper limit at step S805 (step S805: Yes), the memory controller 200 performs an error process (step S806) without performing a rewriting process. In the error process, the memory controller 200 notifies the host computer 100 of the fact that the writing of data has been completed abnormally. Thereafter, the memory controller 200 ends the writing process.

[Processing Steps of a Verification/Writing Process (Processes on the Memory Controller Side)]

Figure 19:
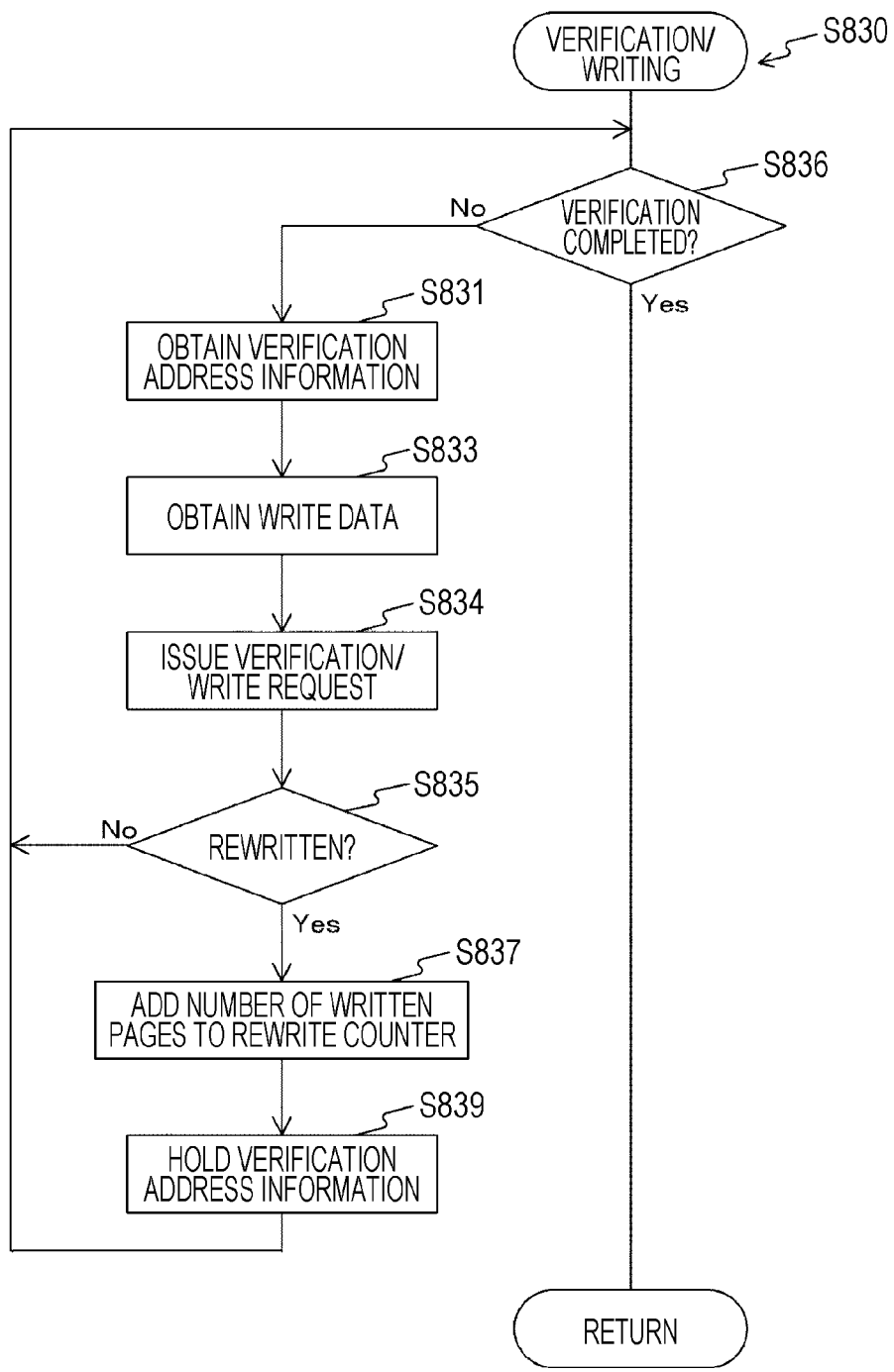
FIG. 19 is a diagram showing an example of the processing steps of a verification/writing process (memory controller) of the third embodiment of the present technology.

FIG. 19 is a diagram showing an example of the processing steps of a verification/writing process (memory controller) of the third embodiment of the present technology. This process is a process corresponding to step S830 described in FIG. 18. First, the memory controller 200 checks whether verification of all data has been completed (step S836). If, as a result, verification of all data has been completed (step S836: Yes), the verification/writing process ends. On the other hand, if verification of all data has not been completed (step S836: No), processing transitions to a verification/writing loop process starting from step S831. The memory controller 200 obtains verification address information (the value of the offset register) from the verification address information holding unit 295 (step S831). Then, the memory controller 200 obtains write data from the host computer 100 on the basis of the verification address information (step S833). In addition, the memory controller 200 identifies a verification destination page address in the memory 300 on the basis of the verification address information, and generates and issues a verification/write request (step S834).

If, as a result of the request, rewriting has not been performed in the memory 300 (step S835: No), the memory controller 200 transitions to the process at step S836. On the other hand, if rewriting has been performed in the memory 300 (step S835: Yes), the memory controller 200 adds the number of written pages in a response, to the rewrite counter (step S837). Then, the memory controller 200 holds, in the verification address information holding unit 295, a page address of a page where the rewriting has been performed, as new verification address information (step S839). The new verification address information is used for the next verification/writing process. Note that the page address (the value of the offset register) related to the verification address information which is obtained at step S831 is held in the verification address information holding unit 295, as the page address of the page where the rewriting has been performed. Hence, the memory controller 200 can specify a relative address in relation to the value of the offset register, without using the offset register in the verification/writing (step S830). Thereafter, the memory controller 200 returns to the process at step S836.

Note that the memory controller 200 outputs write information based on a write response, to a determination unit 280 when the process at step S834 is performed.

Note that the verification address information holding unit 295 can be configured, for example, to include a first and a second first-in first-out (FIFO) memory. Verification address information generated in normal writing or in an immediately preceding verification/writing loop is held in the first FIFO memory, and is obtained in turn at step S831. On the other hand, new verification address information generated at step S839 is held in the second FIFO memory. Thereafter, upon ending the verification/writing process, the verification address information held in the second FIFO memory is moved to the first FIFO memory, by which the verification address information can serve as a processing target at step S831 in the next verification/writing process. In addition, as verification address information, the value of the offset register can be used.

Note that the normal writing (step S810) and stable state determination (step S820) processes of FIG. 18 are similar to the normal writing (step S910) and the stable state determination (step S920) which are described in FIG. 7, and thus, description thereof is omitted. In addition, the processes of the memory 300 are also similar to the processes of the first embodiment of the present technology, and thus, description thereof is omitted.

As such, according to the third embodiment of the present technology, information on a page address where rewriting has been performed is held as verification address information, and verification is performed on the basis of the verification address information. Thus, a verification process for memory cells where writing has succeeded can be suppressed. Hence, the speed of a writing process can be increased.

4. Fourth Embodiment

In the above-described first embodiment, although normal writing is performed continuously, verification and rewriting are performed alternately, and thus, there is a problem that generation of requests is troublesome. Due to this, a verification/write request where a verification request and a write request are integrated is used. On the other hand, however, processes for a request performed in the memory 300 are complicated. In a fourth embodiment of the present technology, on the other hand, verification and rewriting are also performed continuously. By this, generation of requests is facilitated.

[Functional Configuration]

Figure 20:
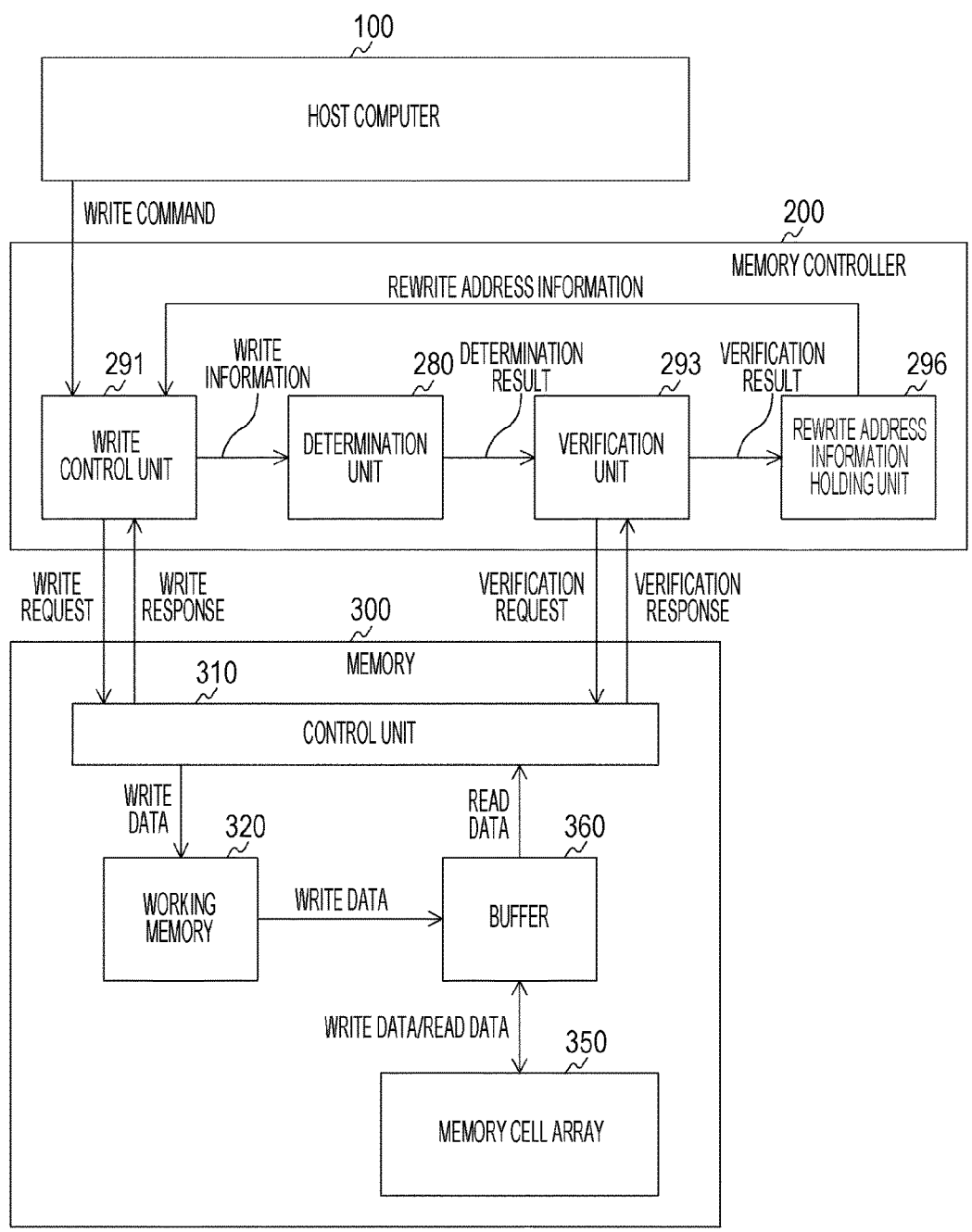
FIG. 20 is a diagram showing an exemplary functional configuration of a fourth embodiment of the present technology.

FIG. 20 is a diagram showing an exemplary functional configuration of the fourth embodiment of the present technology. A memory controller 200 in the drawing includes a write control unit 291, a determination unit 280, a verification unit 293, and a rewrite address information holding unit 296.

The write control unit 291 performs writing of data and rewriting of write data based on a result of verification. The write control unit 291 issues a write request to a memory 300. In response to the request, the memory 300 outputs the number of written pages in writing and rewriting, as a write response, to the memory controller 200. Thereafter, the write control unit 291 outputs the number of written pages as write information to the determination unit 280.

The rewrite address information holding unit 296 holds rewrite address information. Here, the rewrite address information is information on a page address in the memory 300 where rewriting is to be performed. The above-described write control unit 291 performs rewriting on the basis of the rewrite address information held in the rewrite address information holding unit 296.

The verification unit 293 performs the aforementioned verification. The verification unit 293 verifies the writing of data on the basis of a result of determination made by the determination unit 280. In addition, the verification unit 293 performs verification by issuing a verification request to the memory 300. In response to the request, the memory 300 performs a verification process described in the first embodiment, and outputs a result of the verification, as a verification response, to the memory controller 200. Thereafter, rewrite address information based on the result of the verification is held in the rewrite address information holding unit 296. As such, the verification unit 293 of the fourth embodiment of the present technology performs only verification, unlike the verification/writing unit 299 described in the first embodiment of the present technology.

As such, in the fourth embodiment of the present technology, verification and rewriting are issued as individual requests. Other configurations are similar to those of the memory controller 200 and the memory 300 which are described in FIG. 4, and thus, description thereof is omitted. Note that the write control unit 291 is an example of a write control unit recited in the claims. The rewrite address information holding unit 296 is an example of a rewrite address information holding unit recited in the claims.

[Processing Steps of a Writing Process (Processes on the Memory Controller Side)]

Figure 21:
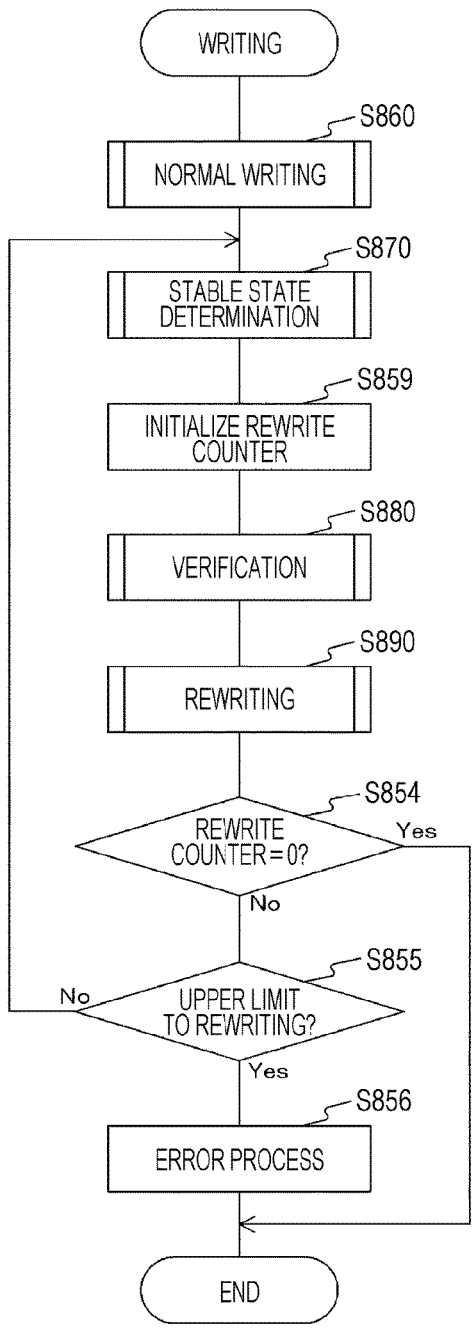
FIG. 21 is a diagram showing an example of the processing steps of a writing process (memory controller) of the fourth embodiment of the present technology.

FIG. 21 is a diagram showing an example of the processing steps of a writing process (memory controller) of the fourth embodiment of the present technology. When a write request is issued from a host computer 100, the memory controller 200 starts a writing process. First, the memory controller 200 interprets the command and performs normal writing (step S860). Then, the memory controller 200 performs a stable state determination process (step S870). Then, the memory controller 200 initializes a rewrite counter (step S859), performs verification (step S880), and performs rewriting (step S890). Thereafter, if the value of the rewrite counter is "0" (step S854: Yes), the memory controller 200 notifies the host computer 100 of the fact that the writing process has been completed normally, and ends the writing process.

If the value of the rewrite counter is not "0" (step S854: No), a rewriting process (a process starting from step S870) is performed in a loop until the value of the rewrite counter becomes "0" and within a range where the number of rewriting processes does not reach its upper limit (step S855: No). However, if the number of rewriting processes has reached its upper limit at step S855 (step S855: Yes), the memory controller 200 performs an error process (step S856) without performing a rewriting process. In the error process, the memory controller 200 notifies the host computer 100 of the fact that the writing of data has been completed abnormally. Thereafter, the memory controller 200 ends the writing process.

Note that the normal writing (step S860) and stable state determination (step S870) processes are similar to the normal writing (step S910) and the stable state determination (step S920) which are described in FIG. 7, and thus, description thereof is omitted.

[Processing Steps of a Verification Process (Processes on the Memory Controller Side)]

Figure 22:
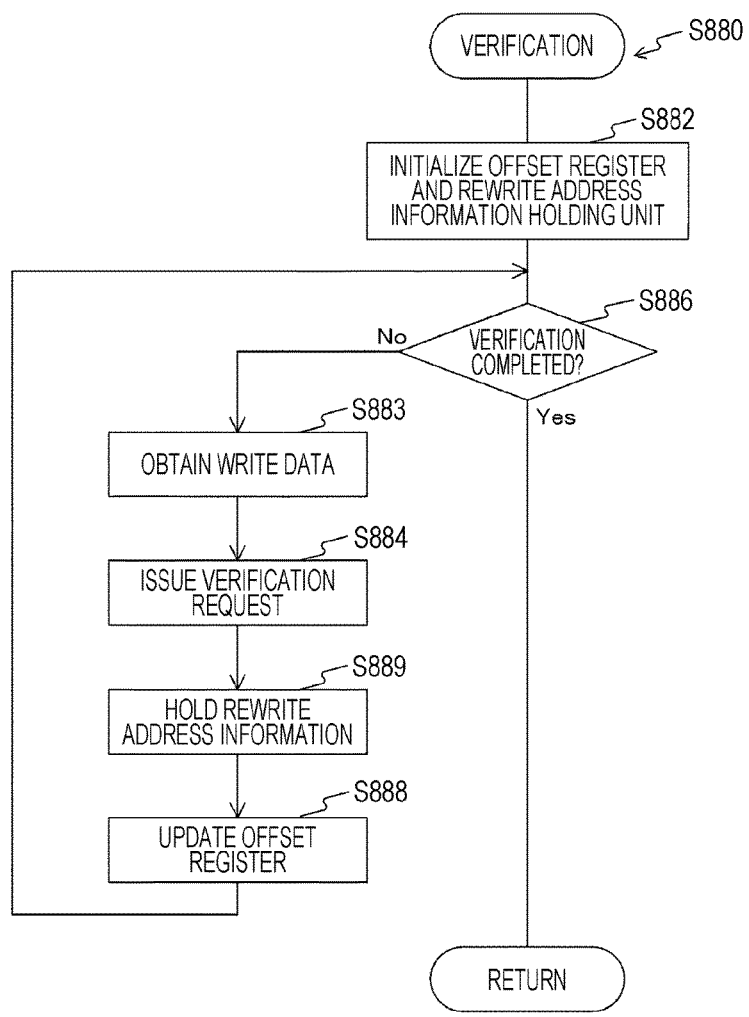
FIG. 22 is a diagram showing an example of the processing steps of a verification process (memory controller) of the fourth embodiment of the present technology.

FIG. 22 is a diagram showing an example of the processing steps of a verification process (memory controller) of the fourth embodiment of the present technology. This process is a process corresponding to step S880 described in FIG. 21. First, the memory controller 200 initializes an offset register and the rewrite address information holding unit 296 (step S882). Then, the memory controller 200 checks whether verification of all data has been completed (step S886). If, as a result, verification of all data has been completed (step S886: Yes), the verification process ends. On the other hand, if verification of all data has not been completed (step S886: No), processing transitions to a process starting from step S883. The memory controller 200 obtains write data from the host computer 100 (step S883). Then, the memory controller 200 generates and issues a verification request, using the write data obtained at step S883 as comparison data (step S884).

Then, the memory controller 200 holds, in the rewrite address information holding unit 296, a result of the request sent back from the memory 300, together with the page address of the page (step S889). By this, a page address of a page whose result of the request is "mismatch" is recognized as a page address of a page that requires rewriting in a subsequent rewriting process. Note that in the fourth embodiment, too, the page address in the memory 300 is specified by a relative address in relation to the value of the offset register. Hence, the page address of a page that requires rewriting is indicated by a relative address using the value of the offset register. Then, the memory controller 200 updates the offset register (step S888) and returns to the process at step S886. Note that the rewrite address information holding unit 296 can be composed of, for example, a RAM that holds address information corresponding to the value of the offset register and a verification result for the address.

[Processing Steps of a Rewriting Process (Processes on the Memory Controller Side)]

Figure 23:
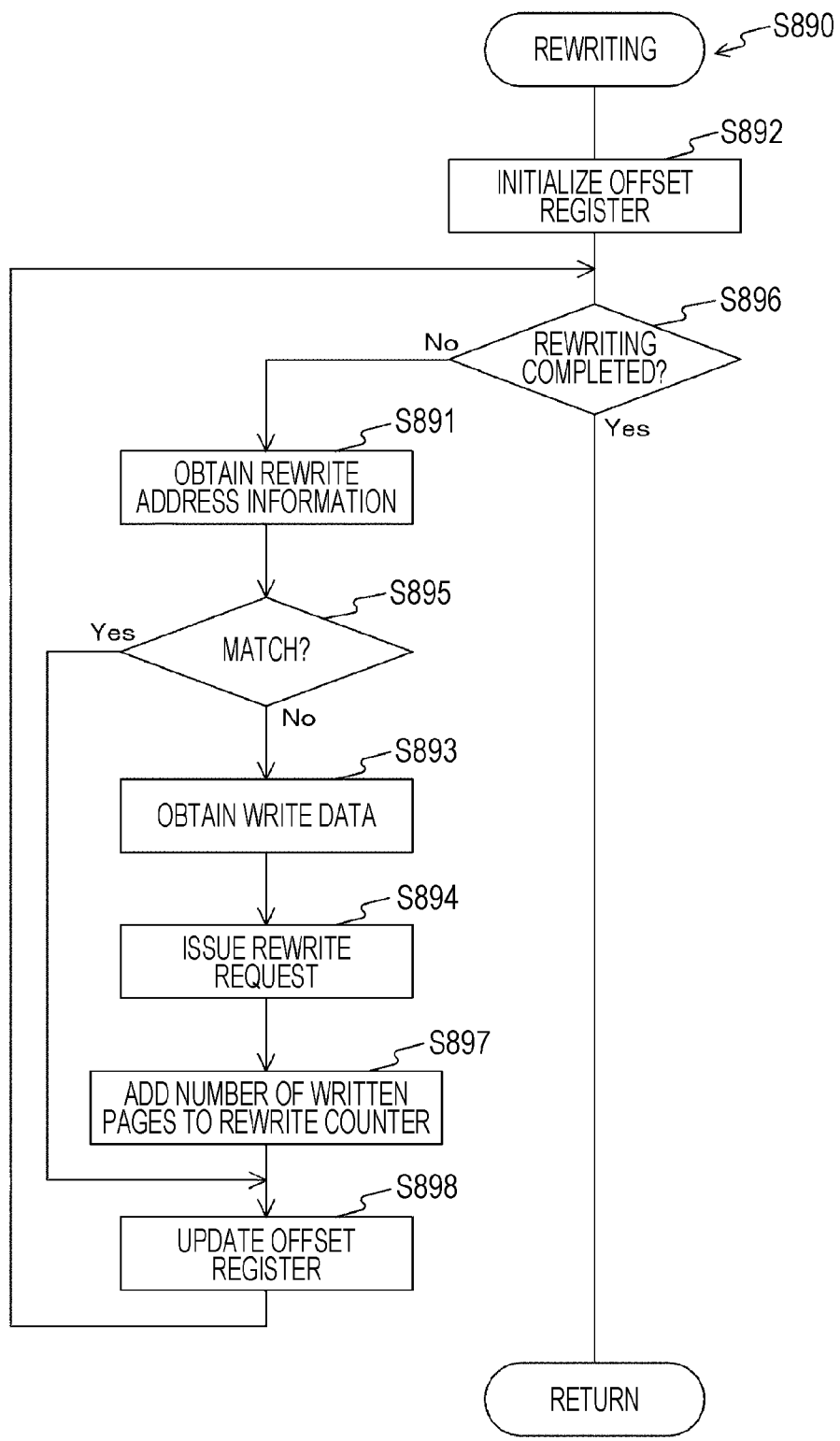
FIG. 23 is a diagram showing an example of the processing steps of a rewriting process (memory controller) of the fourth embodiment of the present technology.

FIG. 23 is a diagram showing an example of the processing steps of a rewriting process (memory controller) of the fourth embodiment of the present technology. This process is a process corresponding to step S890 described in FIG. 21. First, the memory controller 200 initializes the offset register (step S892). Then, the memory controller 200 checks whether rewriting of all data has been completed (step S896). If, as a result, rewriting of all data has been completed (step S896: Yes), the rewriting process ends.

On the other hand, if rewriting of all data has not been completed (step S896: No), processing transitions to a process starting from step S891. The memory controller 200 obtains a verification result for an address corresponding to the value of the offset register from the rewrite address information holding unit 296 (step S891). If the result is "mismatch" (step S895: No), the memory controller 200 obtains write data from the host computer 100 (step S893). Then, the memory controller 200 generates and issues a rewrite request including the write data obtained at step S893 (step S894). After rewrite operation by the memory 300 is completed and a write response is outputted from the memory 300, the memory controller 200 adds the number of written pages in the response, to the rewrite counter (step S897) and transitions to a process at step S898.

On the other hand, if the result is "match" (step S895: Yes), rewriting is not required and thus the memory controller 200 skips the processes at steps S893, S894, and S897 and transitions to a process at step S898. At step S898, the memory controller 200 updates the offset register (step S898) and returns to the process at step S896. Note that the memory controller 200 outputs write information based on the write response, to the determination unit 280 when the process at step S894 is performed.

[Processing Steps of a Verification Process (Processes on the Memory Side)]

Figure 24:
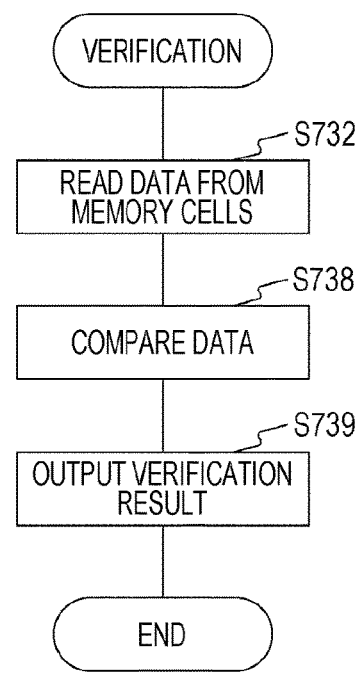
FIG. 24 is a diagram showing an example of the processing steps of a verification process (memory) of the fourth embodiment of the present technology.

FIG. 24 is a diagram showing an example of the processing steps of a verification process (memory) of the fourth embodiment of the present technology. When a verification request is issued from the memory controller 200, the memory 300 starts a verification process. Note that comparison data associated with the request is stored in a working memory 320. First, the memory 300 reads data from memory cells (step S732). The read data is held in a buffer 360. Then, the memory 300 compares the data (step S738). Specifically, the memory 300 compares the comparison data stored in the working memory 320 with the data held in the buffer 360. A result of the comparison is outputted to the memory controller 200 (step S739) and the verification process ends.

[Processing Steps of a Rewriting Process (Processes on the Memory Side)]

Figure 25:
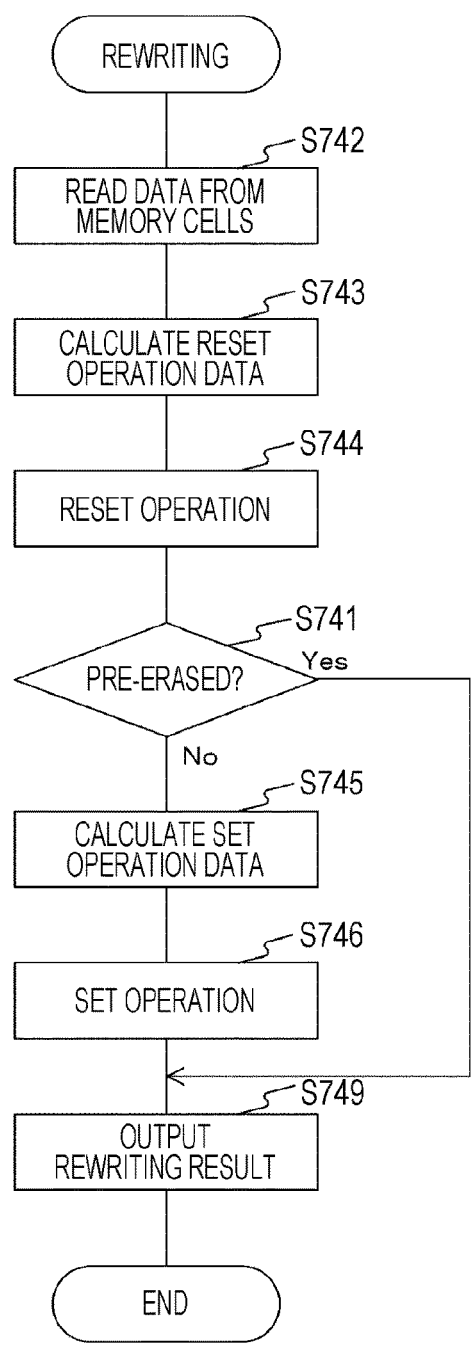
FIG. 25 is a diagram showing an example of the processing steps of a rewriting process (memory) of the fourth embodiment of the present technology.

FIG. 25 is a diagram showing an example of the processing steps of a rewriting process (memory) of the fourth embodiment of the present technology. When a rewrite request is issued from the memory controller 200, the memory 300 starts a rewriting process. First, the memory controller 200 reads data from memory cells (step S742). Unlike the rewriting process described in FIG. 13, since data is not held in the buffer 360, the reading process is required. Then, the memory 300 calculates reset operation data (step S743) and performs a reset operation (step S744).

Then, the memory 300 checks whether pre-erasing has been performed (step S741). A case in which pre-erasing has not been performed corresponds to the aforementioned (d) case of a rewrite operation (with no pre-erasing). The memory 300 calculates set operation data (step S745), performs a set operation (step S746), and transitions to a process at step S749. On the other hand, a case in which pre-erasing has been performed corresponds to the aforementioned (c) case of a rewrite operation (with pre-erasing). The memory 300 skips the processes at steps S745 and S746 and transitions to a process at step S749. At step S749, the memory 300 outputs the number of pages where writing has been performed, as a result of the writing process, to the memory controller 200 (step S749) and ends the rewriting process.

As such, in the fourth embodiment of the present technology, since continuous processes are performed not only for normal writing but also for verification and rewriting, generation of requests can be facilitated compared to a case of alternately performing verification and rewriting. This is remarkable when a configuration is such that data of a plurality of pages is added to verification and rewrite requests.

[First Variant]

In the above-described fourth embodiment, in a rewriting process for a case with pre-erasing, only a reset operation is performed; however, even in a case with pre-erasing, rewriting may be performed by a reset operation and a set operation. This is because, as in the aforementioned fifth variant of the first embodiment, even when a write disturb phenomenon occurs, reversal of data written into memory cells is prevented, enabling to improve the reliability of writing of data. The write and rewrite operations are similar to (a') to (d') described in the aforementioned fifth variant of the first embodiment, and thus, description thereof is omitted.

[Processing Steps of a Rewriting Process (Processes on the Memory Side)]

Figure 26:
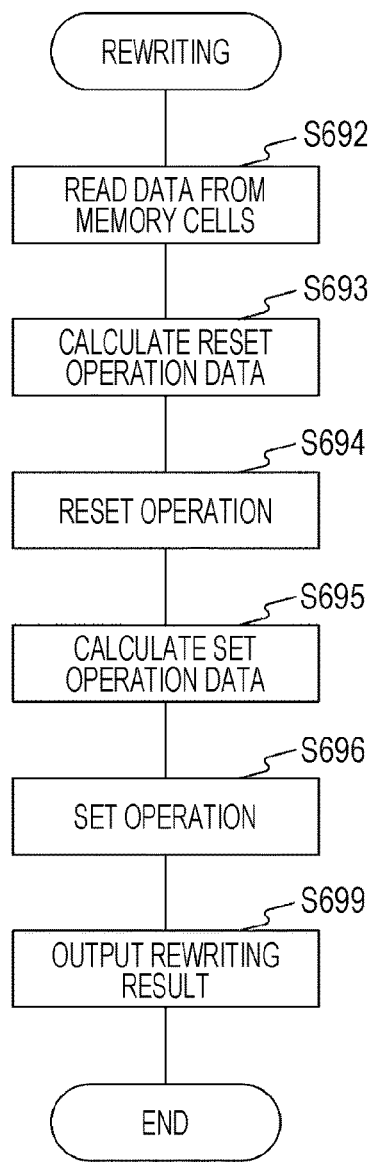
FIG. 26 is a diagram showing an example of the processing steps of a rewriting process (memory) of a first variant of the fourth embodiment of the present technology.

FIG. 26 is a diagram showing an example of the processing steps of a rewriting process (memory) of a first variant of the fourth embodiment of the present technology. First, the memory 300 reads page data from memory cells (step S692). Then, the memory 300 calculates reset operation data (step S693) and performs a reset operation (step S694). Then, the memory 300 calculates set operation data (step S695) and performs a set operation (step S696). Then, the memory 300 outputs the number of pages where writing has been performed, as a result of the rewriting process, to the memory controller 200 (step S699) and ends the rewriting process.

[Second Variant]

In the above-described fourth embodiment, at step S889 of the verification process described in FIG. 22, the results of all verification requests are held as rewrite address information in the rewrite address information holding unit 296. However, a page address of a page whose result of a verification request is "mismatch" may be held as address information. This is because a page address of a page that requires rewriting is identified in a subsequent rewriting process and thus the process is simplified.

[Processing Steps of a Verification Process]

Figure 27:
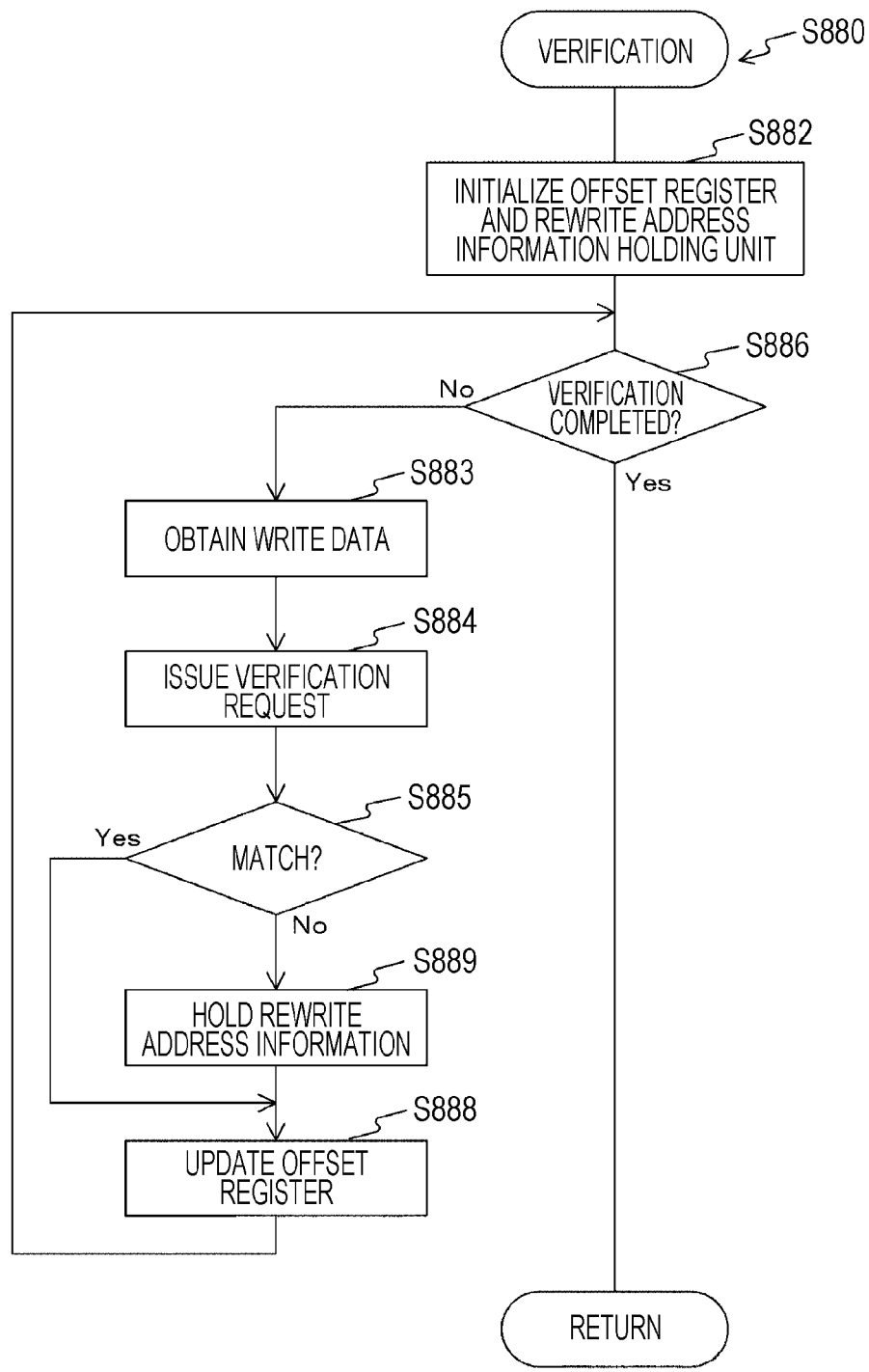
FIG. 27 is a diagram showing an example of the processing steps of a verification process (memory controller) of a second variant of the fourth embodiment of the present technology.

FIG. 27 is a diagram showing an example of the processing steps of a verification process (memory controller) of a second variant of the fourth embodiment of the present technology. This process is a process corresponding to step S880 described in FIG. 21. At step S885, the memory controller 200 checks a result of a request sent back from the memory 300. If the result is not "match" (step S885: No), the memory controller 200 holds, in the rewrite address information holding unit 296, a page address of a page related to the verification request (step S889). Thereafter, processing transitions to a process at step S888. On the other hand, if the result of a request sent back from the memory 300 is "match" (step S885: Yes), the memory controller 200 skips the process at step S889 and transitions to the process at step S888. By this, only a page address of a page whose result of the verification request is "mismatch" can be held as a verification result in the rewrite address information. At step S888, the memory controller 200 updates the offset register (step S888) and returns to a process at step S886. Other processes are similar to the processing steps described in FIG. 22 and thus description thereof is omitted.

[Processing Steps of a Rewriting Process (Processes on the Memory Controller Side)]

Figure 28:
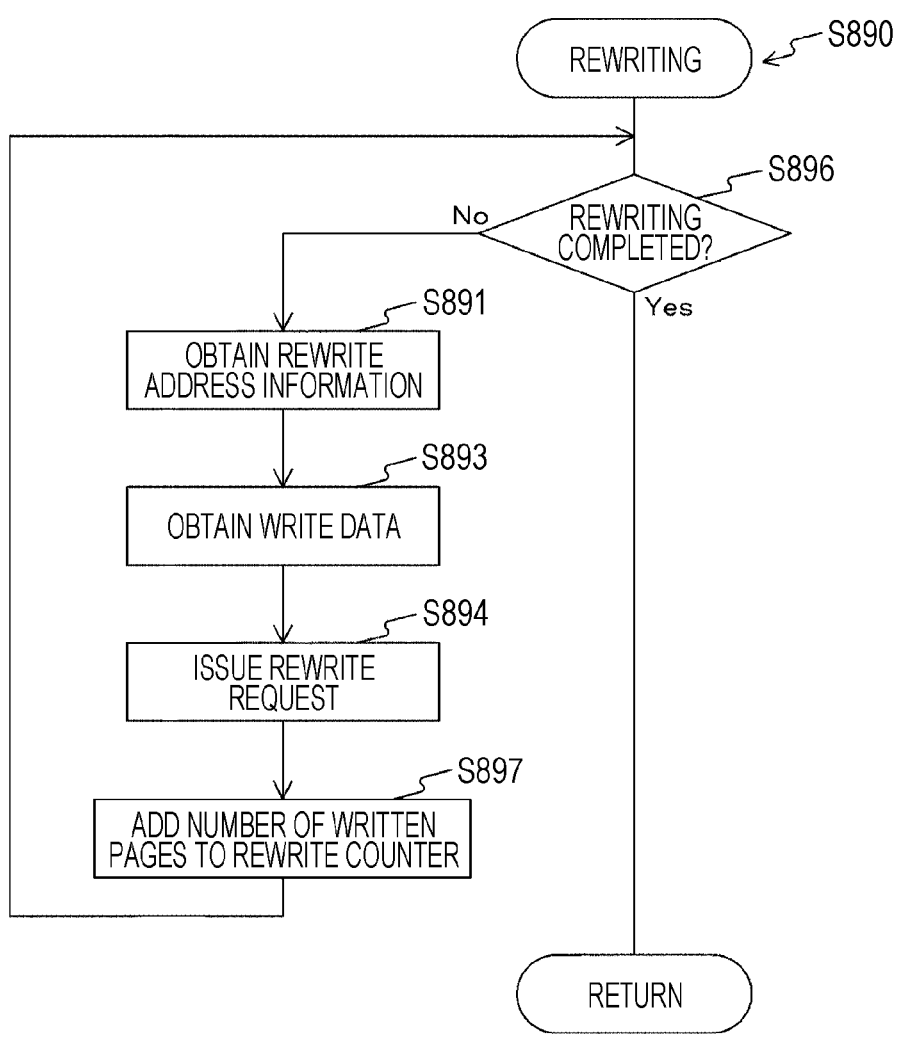
FIG. 28 is a diagram showing an example of the processing steps of a rewriting process (memory controller) of the second variant of the fourth embodiment of the present technology.

FIG. 28 is a diagram showing an example of the processing steps of a rewriting process (memory controller) of the second variant of the fourth embodiment of the present technology. This process is a process corresponding to step S890 described in FIG. 21. In addition, this process is such that the processes at steps S892, S895, and S898 are removed from the processing steps described in FIG. 23. By this, the memory controller 200 identifies a page that requires rewriting and performs rewriting. Other processes are similar to the processing steps described in FIG. 21 and thus description thereof is omitted.

[Third Variant]

In the above-described fourth embodiment, in the verification process described in FIG. 22, verification is performed for all pages which are targets of a writing process. However, verification may be performed only on a page that requires verification, using the verification address information holding unit 295 described in the third embodiment. This is because a verification process is simplified.

[Functional Configuration]

Figure 29:
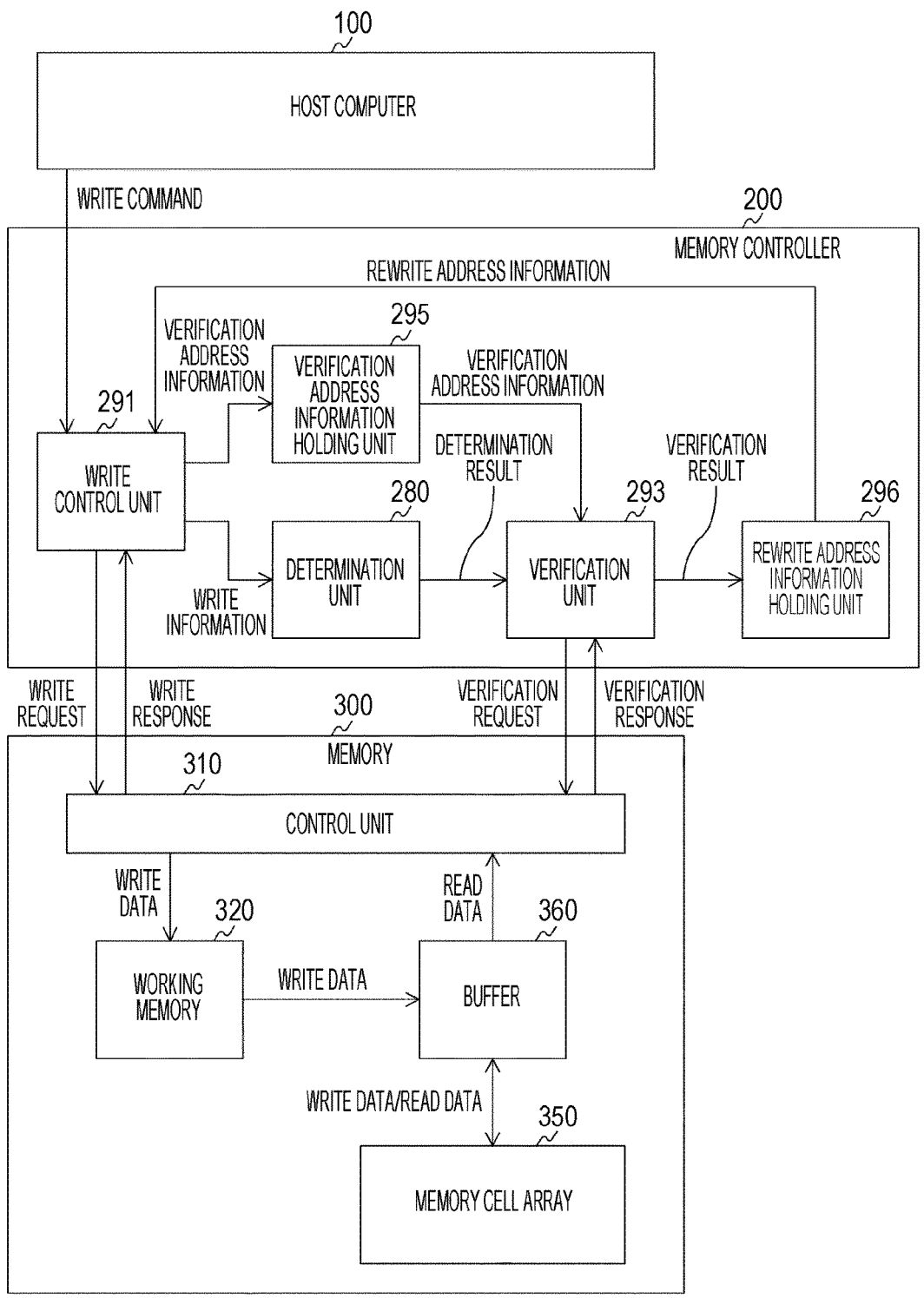
FIG. 29 is a diagram showing an exemplary functional configuration of a third variant of the fourth embodiment of the present technology.

FIG. 29 is a diagram showing an exemplary functional configuration of a third variant of the fourth embodiment of the present technology. A memory controller 200 in the drawing includes a verification address information holding unit 295. Other configurations are similar to the exemplary functional configuration described in FIG. 20, and thus, description thereof is omitted.

[Processing Steps of a Writing Process (Processes on the Memory Controller Side)]

Figure 30:
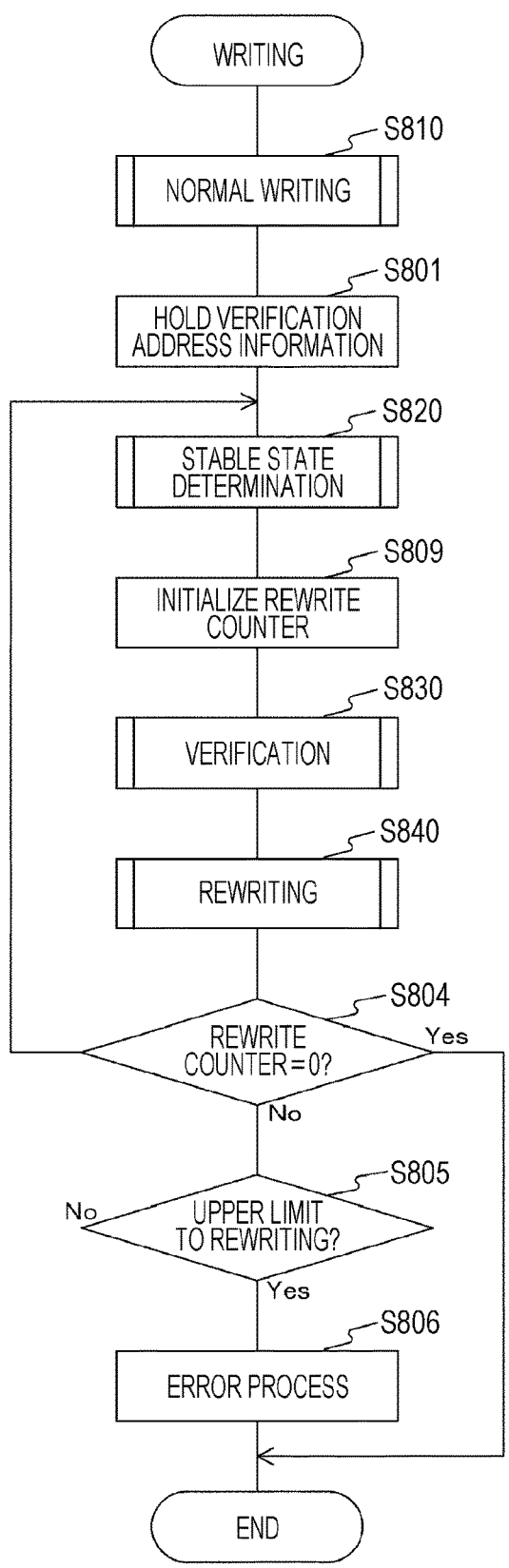
FIG. 30 is a diagram showing an example of the processing steps of a writing process (memory controller) of the third variant of the fourth embodiment of the present technology.

FIG. 30 is a diagram showing an example of the processing steps of a writing process (memory controller) of the third variant of the fourth embodiment of the present technology. This process is such that in the processing steps described in FIG. 21, a process at step S801 is added between steps S810 and S820. Other processes are similar to the processing steps described in FIG. 21, and thus, description thereof is omitted.

[Processing Steps of a Verification Process]

Figure 31:
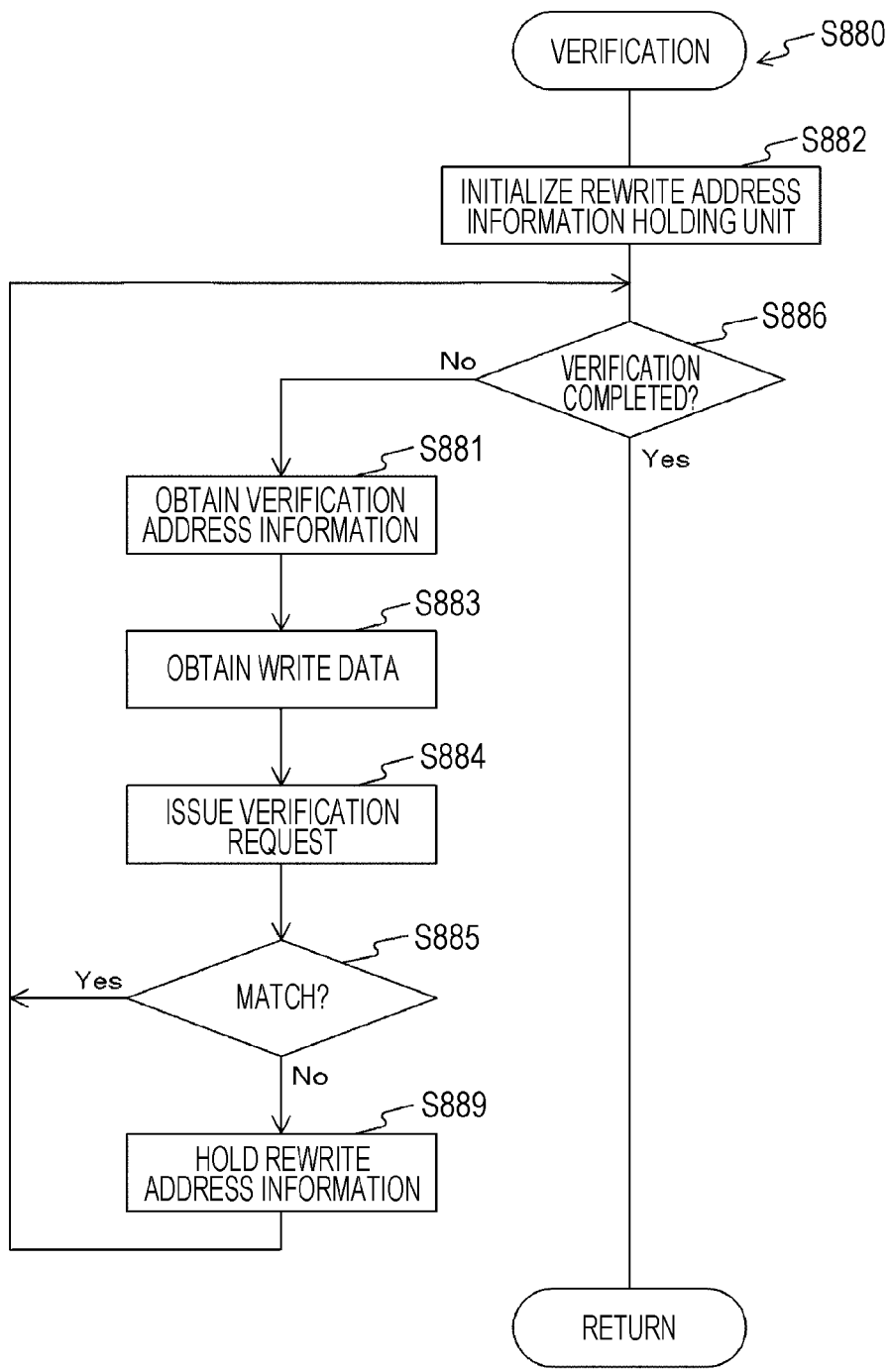
FIG. 31 is a diagram showing an example of the processing steps of a verification process (memory controller) of the third variant of the fourth embodiment of the present technology.

FIG. 31 is a diagram showing an example of the processing steps of a verification process (memory controller) of the third variant of the fourth embodiment of the present technology. This process is a process corresponding to step S880 described in FIG. 21. At step S882, the memory controller 200 only performs initialization of the rewrite address information holding unit 296. At step S881, the memory controller 200 obtains verification address information from the verification address information holding unit 295 (step S881). At step S885, the memory controller 200 checks a result of a request sent back from the memory 300. If the result is not "match" (step S885: No), the memory controller 200 holds, in the rewrite address information holding unit 296, a page address of a page related to the verification request (step S889). Thereafter, processing transitions to a process at step S886. On the other hand, if the result of a request sent back from the memory 300 is "match" (step S885: Yes), the memory controller 200 skips the process at step S889 and transitions to the process at step S886. By this, a page that requires verification is identified and verification is performed, and only a page address of a page whose result of the verification request is "mismatch" can be held as a verification result in the rewrite address information holding unit 296. Note that a process at step S888 is not necessary and thus is removed. Other processes are similar to the processing steps described in FIG. 22, and thus, description thereof is omitted.

[Processing Steps of a Rewriting Process (Processes on the Memory Controller Side)]

Figure 32:
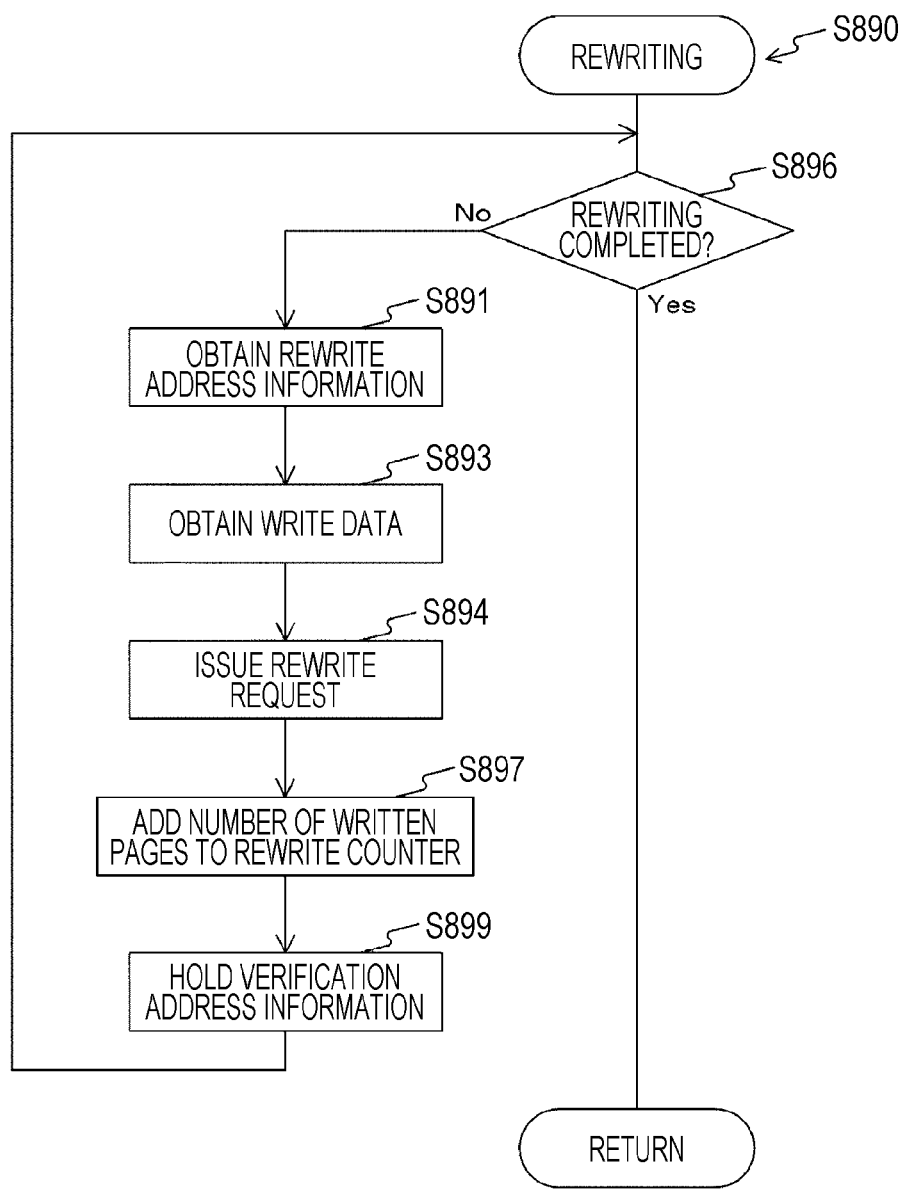
FIG. 32 is a diagram showing an example of the processing steps of a rewriting process (memory controller) of the third variant of the fourth embodiment of the present technology.

FIG. 32 is a diagram showing an example of the processing steps of a rewriting process (memory controller) of the third variant of the fourth embodiment of the present technology. This process is a process corresponding to step S890 described in FIG. 21. In addition, this process is such that the processes at steps S892, S895, and S898 are removed from the processing steps described in FIG. 23, and a process at step S899 is added after step S897. By this, the memory controller 200 identifies a page that requires rewriting and performs rewriting, and holds, in the verification address information holding unit 295, a page address of the page where the rewriting has been performed. Other processes are similar to the processing steps described in FIG. 21, and thus, description thereof is omitted.

[Fourth Variant]

Although in the above-described fourth embodiment, the memory controller 200 includes the write control unit 291, the determination unit 280, the verification unit 293, and the rewrite address information holding unit 296, the memory 300 may include these units. This is because the processes of the memory controller 200 can be simplified. In this case, the memory controller 200 issues only a write request to the memory 300. Then, the memory 300 performs writing, determination, and verification processes on the basis of the request.

5. Fifth Embodiment

The information processing system of the above-described first embodiment does not have a data backup function. On the other hand, an information processing system of a fifth embodiment of the present technology has a data backup function, and backs up data when power supply abnormality occurs.

[Configuration of the Information Processing System]

Figure 33:
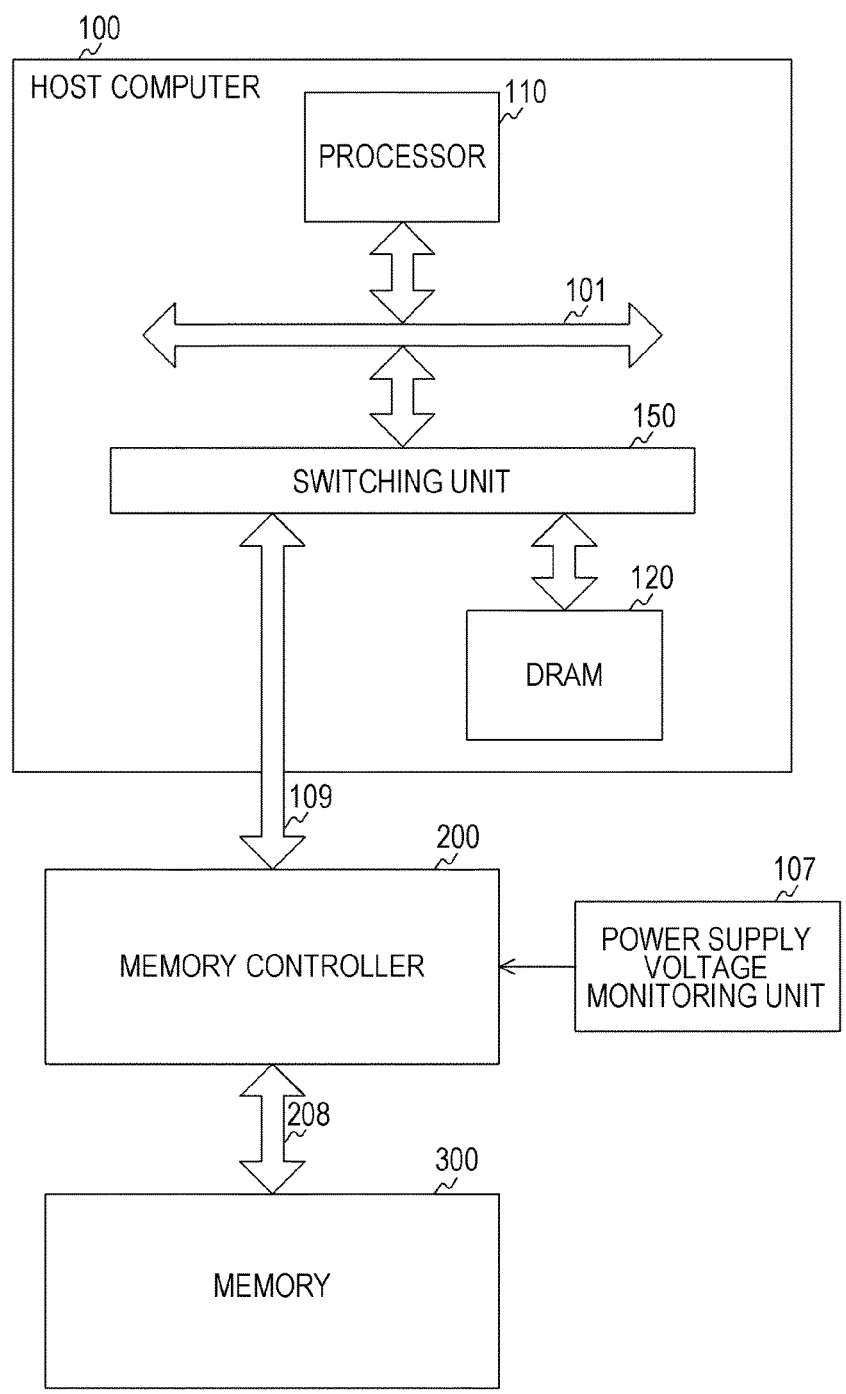
FIG. 33 is a diagram showing an exemplary configuration of an information processing system of a fifth embodiment of the present technology.

FIG. 33 is a diagram showing an exemplary configuration of an information processing system of the fifth embodiment of the present technology. The information processing system in the drawing is an example of an information processing system having a data backup function. The information processing system in the drawing includes a host computer 100, a memory controller 200, a memory 300, signal lines 109 and 208, and a power supply voltage monitoring unit 107. The power supply voltage monitoring unit 107 monitors the voltage of power supplied to the information system. When the voltage of power is reduced due to power supply abnormality such as a power failure, the power supply voltage monitoring unit 107 outputs information on the reduction in power supply voltage, to the memory controller 200. Note that the information processing system in the drawing includes a backup power supply such as a battery or a supercapacitor (not shown). By feeding from the backup power supply, even when power supply abnormality occurs, the information processing system can operate, though for a short time. During this period, the memory controller 200 saves, in the memory 300, data held in the host computer.

The host computer 100 in the drawing differs from the host computer 100 described in FIG. 1 in that the host computer 100 includes a switching unit 150 instead of the memory controller interface 130. The switching unit 150 switches a connection destination of a DRAM 120 to a processor 110 or the memory controller 200. At normal times, the switching unit 150 connects the DRAM 120 to the processor 110 through a bus apparatus 101. The DRAM 120 stores data required for the operation of the processor 110. When power supply abnormality occurs, the memory controller 200 that has obtained information on a reduction in power supply voltage from the power supply voltage monitoring unit 107 outputs a control signal to the switching unit 150. By this, the switching unit 150 connects the DRAM 120 to the memory controller 200. Other configurations of the information processing system are similar to those of the information processing system described in FIG. 1, and thus, description thereof is omitted.

[Configuration of the Memory Controller]

Figure 34:
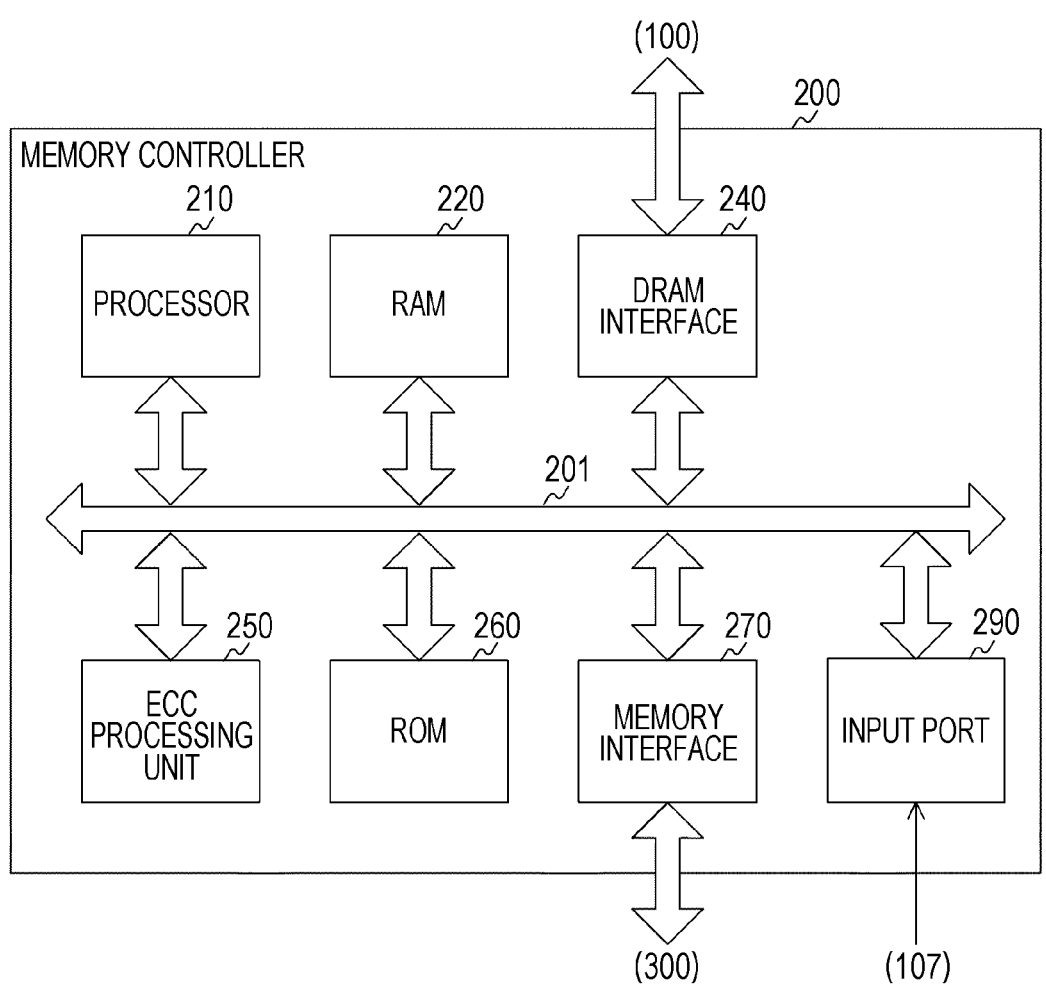
FIG. 34 is a diagram showing an exemplary configuration of a memory controller of the fifth embodiment of the present technology.

FIG. 34 is a diagram showing an exemplary configuration of the memory controller of the fifth embodiment of the present technology. The memory controller 200 in the drawing differs from the memory controller 200 described in FIG. 2 in that the memory controller 200 includes a DRAM interface 240 instead of the host interface 230, and includes an input port 290. The DRAM interface 240 is an interface that interacts with the DRAM 120 of the host computer 100. The input port 290 is an input port to which an output of the power supply voltage monitoring unit 107 is connected. Information on a reduction in power supply voltage which is generated by the power supply voltage monitoring unit 107 is inputted to the input port 290. Other configurations of the memory controller 200 are similar to those of the memory controller 200 described in FIG. 2, and thus, description thereof is omitted. In addition, the configuration of the memory 300 is also similar to that of the memory 300 described in FIG. 3, and thus, description thereof is omitted.

[Functional Configuration]

Figure 35:
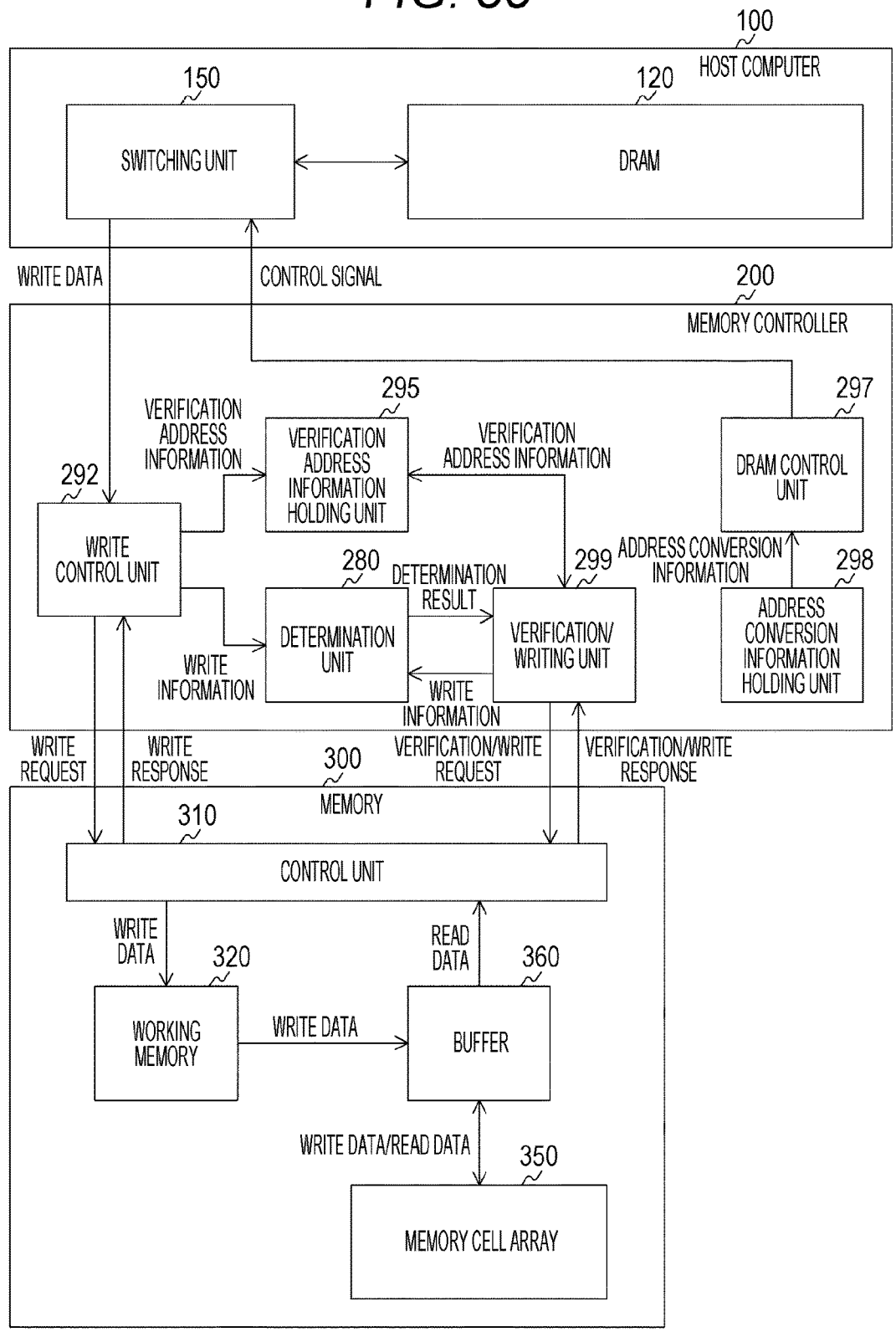
FIG. 35 is a diagram showing an exemplary functional configuration of the fifth embodiment of the present technology.

FIG. 35 is a diagram showing an exemplary functional configuration of the fifth embodiment of the present technology. The drawing assumes a functional configuration for writing of data. The memory controller 200 in the drawing differs from the memory controller 200 described in FIG. 17 in that the memory controller 200 includes a DRAM control unit 297 and an address conversion information holding unit 298.

The DRAM control unit 297 controls the switching unit 150. In addition, the DRAM control unit 297 also controls the DRAM 120 through the switching unit 150. The DRAM control unit 297 outputs a control signal to the switching unit 150 upon power supply abnormality to switch a connection destination of the DRAM 120 from the processor 110 to the memory controller 200. Thereafter, the DRAM control unit 297 outputs a control signal to the DRAM 120 through the switching unit 150, and thereby accesses the DRAM 120 to output data stored in the DRAM 120. In addition, the DRAM control unit 297 also generates address conversion information which is information on address conversion relative to a memory address in the DRAM 120. The address conversion information will be described later. A write control unit 292 captures the data outputted from the DRAM 120, as write data to the memory 300. The address conversion information holding unit 298 holds the address conversion information.

Other configurations of the memory controller 200 and the memory 300 are similar to those of the memory controller 200 and the memory 300 described in FIG. 17, and thus, description thereof is omitted.

[Writing Process of the Information Processing System]

When information on a reduction in power supply voltage is inputted from the power supply voltage monitoring unit 107, the DRAM control unit 297 accesses the DRAM 120 to output all data stored in the DRAM 120. The write control unit 292 generates a request, and outputs the data as write data to the memory 300. Thereafter, the write data is stored in a memory cell array 350 of the memory 300. Hence, the storage capacity of the memory 300 needs to be larger than or equal to the storage capacity of the DRAM 120. After writing the data, verification and rewriting based on a result of the verification are performed by a verification/writing unit 299. At this time, data in the DRAM 120 that requires rewriting is moved within the DRAM 120.

[Movement of Data]

Figure 36:
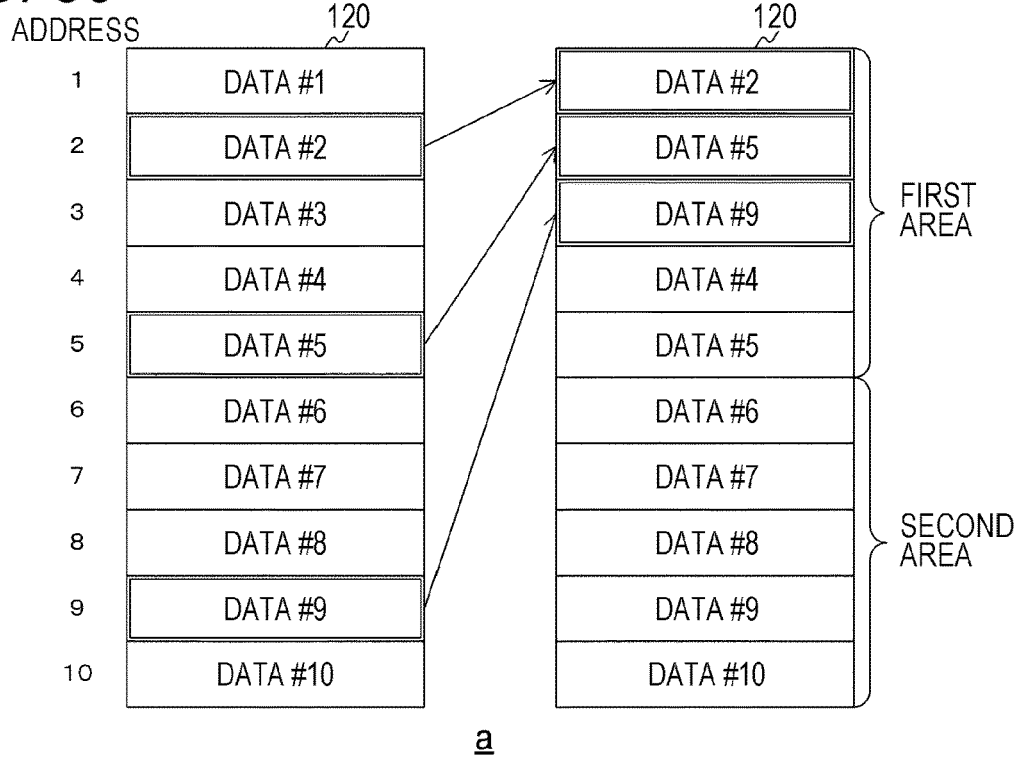
FIG. 36 is a diagram describing the movement of data in a DRAM.
Figure 36:
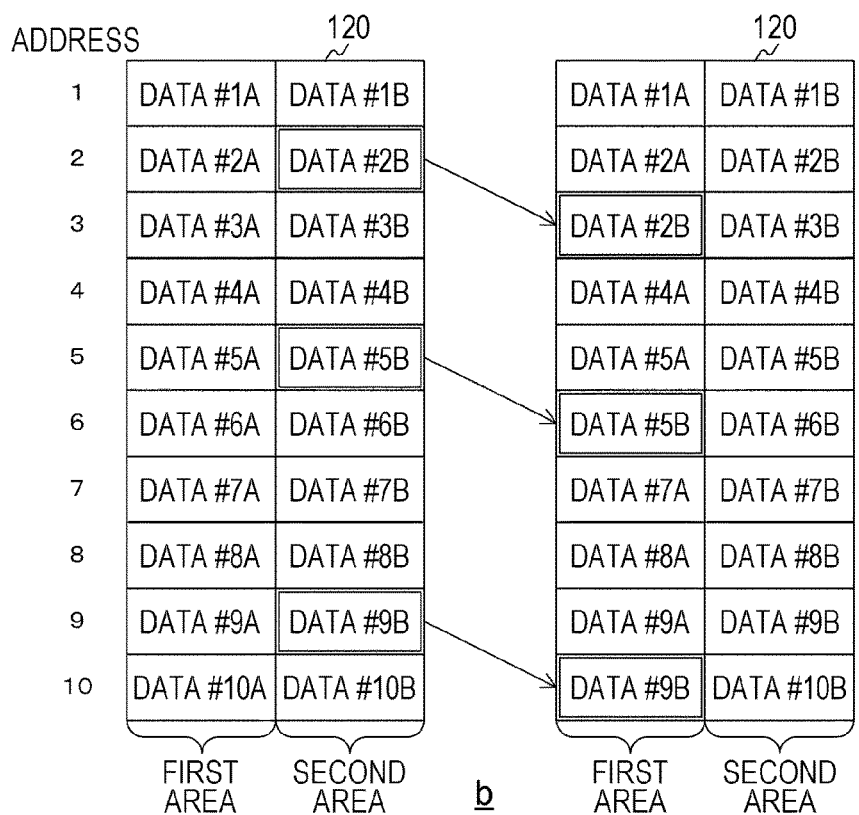

FIG. 36 is a diagram describing the movement of data in the DRAM. The drawing shows an example of the DRAM 120 having 10 storage areas. A state before the movement of data is shown on the left side of the paper, and a state after the movement of data is shown on the right side. The DRAM 120 in "a" of the drawing is composed of two DRAMs. Each DRAM has five storage areas, and the DRAMs are disposed for upper addresses and lower addresses. The DRAMs are represented as a first area and a second area, respectively.

The DRAM 120 before the movement of data stores data #1 to data #10 in address order. A case is assumed in which data is written into the memory 300 by the memory controller 200, and as a result of verification, rewriting is required for data #2, data #5, and data #9. Before performing rewriting, the DRAM control unit 297 moves the above-described data to a DRAM corresponding to the first area. Thereafter, power supply to a DRAM corresponding to the second area is stopped. By this, the power consumption of the DRAM 120 can be reduced, and a small-capacity battery or supercapacitor serving as a backup power supply can be used. Thereafter, rewriting is performed on the moved data as a target.

"b" of the drawing shows an example in which the DRAM 120 is divided in a data direction. Namely, upper bit data is allocated to a first area, and lower bit data is allocated to a second area. As in the above-described example, it is assumed that rewriting is required for data #2, data #5, and data #9. In "b" of the drawing, data #2B, data #5B, and data #9B which are stored in the second area are moved to the first area. Thereafter, power supply to a DRAM corresponding to the second area is stopped.

As such, in the fifth embodiment of the present technology, by moving data in the DRAM 120 which is composed of a plurality of DRAMs, data is put together in one of the DRAMs. Hence, before the movement of data, there is a need to determine whether the amount of data to be moved is the amount of data that can be put together. For a method for the determination, for example, a determination method can be adopted in which the capacity of the plurality of DRAMs composing the DRAM 120 is used as a threshold value, and it is determined whether the amount of data where the next verification is performed is less than or equal to the threshold value. For calculation of the amount of data, verification address information held in a verification address information holding unit 295 can be utilized. Namely, the amount of data which is obtained by multiplying the number of page addresses held in verification address information by the amount of data in a page can be used as the amount of data where the next verification is performed.

Note that for a scheme for a writing process of the memory controller 200 of the fifth embodiment of the present technology, not only this scheme including the verification address information holding unit (a scheme of the third embodiment of the present technology), but also the above-described other schemes can be utilized. Namely, it is also possible to utilize a scheme including a write condition setting unit (a scheme of the second embodiment of the present technology) and a scheme including a rewrite address information holding unit (a scheme of the fourth embodiment of the present technology). In addition, it is also possible to use a scheme described in the first embodiment that does not use the verification address information holding unit, etc.

Note that with the movement of data there arises a need to convert the address of the data. The above-described address conversion information is information on address conversion involved in the movement of data, and is generated by the DRAM control unit 297 and held in the address conversion information holding unit 298. Upon subsequent access to the DRAM 120, the DRAM control unit 297 performs access on the basis of the address conversion information held in the address conversion information holding unit 298.

[Processing Steps of a Writing Process (Processes on the Memory Controller Side)]

Figure 37:
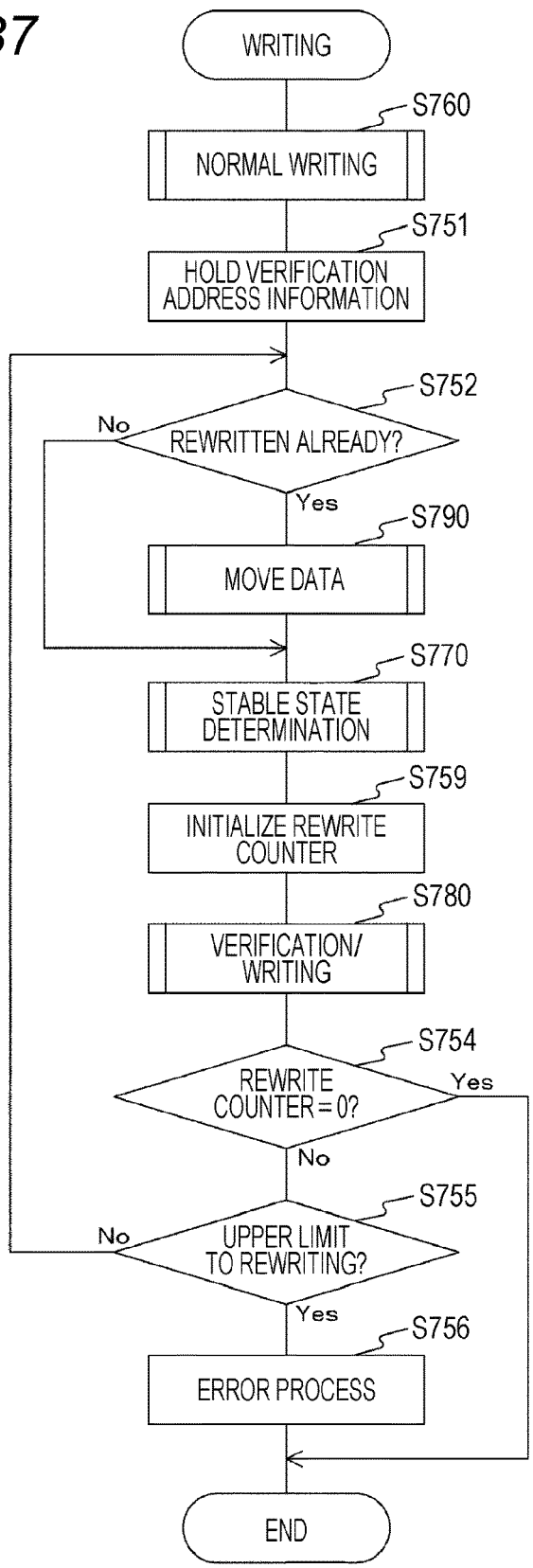
FIG. 37 is a diagram showing an example of the processing steps of a writing process (memory controller) of the fifth embodiment of the present technology.

FIG. 37 is a diagram showing an example of the processing steps of a writing process (memory controller) of the fifth embodiment of the present technology. When information on a reduction in power supply voltage is inputted from the power supply voltage monitoring unit 107, the memory controller 200 outputs a control signal to the switching unit 150. By this, the switching unit 150 connects the DRAM 120 to the memory controller 200. Thereafter, the memory controller 200 starts a writing process. First, the memory controller 200 performs normal writing on all page data in the DRAM 120 (step S760). Then, the memory controller 200 holds verification address information (step S751). In the fifth embodiment of the present technology, the page addresses of all pages which are write targets are held as verification address information in the verification address information holding unit 295. Then, the memory controller 200 checks whether rewriting has been already performed on the memory 300 (step S752). If rewriting has been performed (step S752: Yes), the memory controller 200 moves data (step S790).

On the other hand, if rewriting has not been performed (step S752: No), the process at step S790 is skipped. Then, the memory controller 200 performs a stable state determination process (step S770). Then, the memory controller 200 initializes a rewrite counter (step S759) and performs verification/writing (step S780). Thereafter, if the value of the rewrite counter is "0" (step S754: Yes), the memory controller 200 ends the writing process. If the value of the rewrite counter is not "0" (step S754: No), a rewriting process (a process starting from step S752) is performed in a loop until the value of the rewrite counter becomes "0" and within a range where the number of rewriting processes does not reach its upper limit (step S755: No).

However, if the number of rewriting processes has reached its upper limit at step S755 (step S755: Yes), the memory controller 200 performs an error process (step S756) without performing a rewriting process. In the error process, the memory controller 200, for example, notifies the host computer 100 of the fact that data backup has failed. Thereafter, the writing process ends. Note that the normal writing (step S760) process is similar to the normal writing (step S910) described in FIG. 7, and thus, description thereof is omitted. The stable state determination (step S770) process is similar to the stable state determination (step S920) described in FIG. 7, and thus, description thereof is omitted. The verification/writing (step S780) process is similar to the verification/writing (step S930) described in FIG. 7, and thus, description thereof is omitted.

[Processing Steps of a Data Movement Process (Processes on the Memory Controller Side)]

Figure 38:
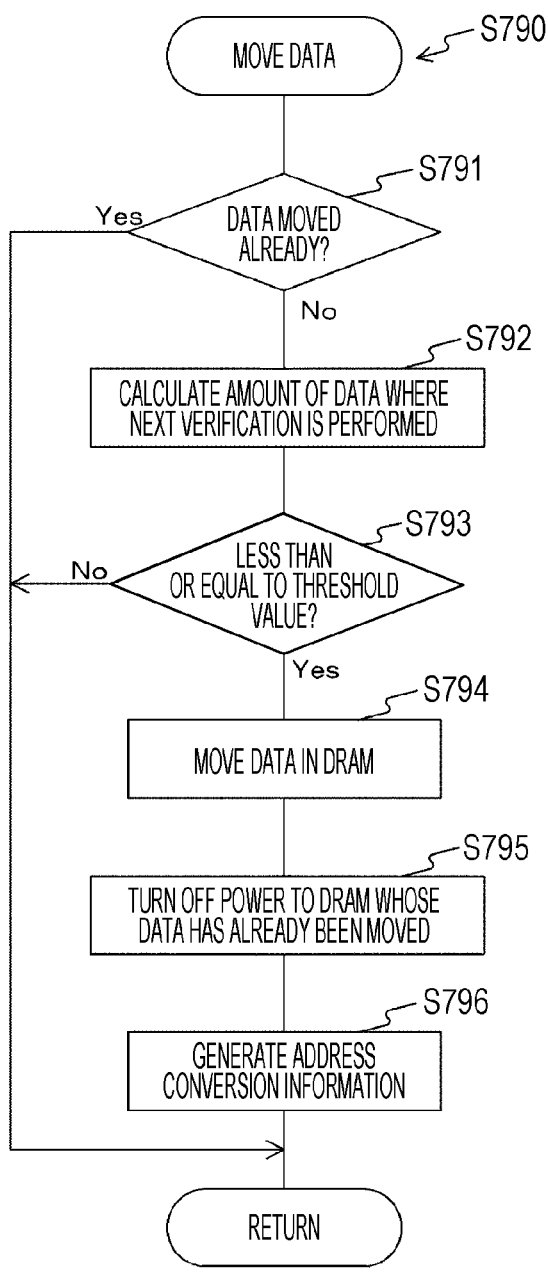
FIG. 38 is a diagram showing an example of the processing steps of a data movement process (memory controller) of the fifth embodiment of the present technology.

FIG. 38 is a diagram showing an example of the processing steps of a data movement process (memory controller) of the fifth embodiment of the present technology. This process is a process corresponding to step S790 described in FIG. 37. First, the memory controller 200 checks whether data has already been moved (step S791). If the data has already been moved (step S791: Yes), the memory controller 200 skips subsequent processes and ends the data movement process. On the other hand, if the data has not already been moved (step S791: No), the amount of data where the next verification is performed is calculated (step S792). If the calculated amount of data is not less than or equal to the threshold value (step S793: No), the memory controller 200 skips subsequent processes and ends the data movement process.

On the other hand, if the calculated amount of data is less than or equal to the threshold value (step S793: Yes), the memory controller 200 moves data in the DRAM 120 (step S794) and turns off the power to a DRAM whose data has already been moved (step S795). Finally, the memory controller 200 generates address conversion information (step S796) and ends the data movement process.

Note that, as described in FIG. 37, the memory controller 200 checks whether rewriting has been performed (step S752) and moves data (step S790). However, it is also possible to configure an information processing system having a data backup function where these processes are omitted.

As such, in the information processing system having a data backup function, too, it is determined whether the state of memory cells is stable, and after the state is stabilized, data is read and verification is performed, by which accurate verification of write data can be performed. In addition, by moving data within the DRAM 120 and supplying power only to a DRAM where data is put together, a backup power supply can be miniaturized. Furthermore, by using verification address information upon the movement of data, calculation of the amount of data related to a data movement process can be simplified.

As such, according to the embodiments of the present technology, after writing data, it is determined whether the state of memory cells is stable, and after waiting for the state of memory cells to be stabilized, data is read and verification is performed, by which accurate verification of write data can be performed. By this, unnecessary rewriting is suppressed, enabling to improve the write reliability of a nonvolatile memory.

Note that the above-described embodiments show examples for embodying the present technology, and the matters in the embodiments and the invention-identifying matters in the claims have a correspondence relationship with each other. Likewise, the invention-identifying matters in the claims and the matters in the embodiments of the present technology that are given the same names as the invention-identifying matters have a correspondence relationship with each other. Note, however, that the present technology is not limited to the embodiments, and can be embodied by making various modifications to the embodiments without departing from the true spirit and scope of the present technology.

In addition, processing steps described in the above-described embodiments may be taken as a method having a series of these steps, and may be taken as a program for causing a computer to perform a series of these steps or as a recording medium that stores the program. For the recording medium, for example, a compact disc (CD), a minidisc (MD), a digital versatile disc (DVD), a memory card, a Blu-ray (registered trademark) disc, etc., can be used.

Note that the effects described in the present specification are merely exemplification and thus are not limited, and there may be other effects.

Note that the present technology can also employ the following configurations.

(1) A memory controller including:
a determination unit that determines whether a state of a memory cell after writing data is stable in a nonvolatile memory including the memory cell, the memory cell having an unstable state period after writing data;
a verification unit that performs verification by comparing read data with write data involved in the writing, the read data being read from the memory cell where the data is written on the basis of a result of the determination; and
a write control unit that performs writing of the data and rewriting of the write data based on a result of the verification.

(2) The memory controller according to (1), wherein in the nonvolatile memory, when reading is performed immediately after writing the data, the written data is corrupted.

(3) The memory controller according to (1), wherein in the nonvolatile memory, immediately after writing the data, the written data is not read normally.

(4) The memory controller according to any of (1) to (3), wherein the determination unit makes the determination on the basis of a lapse of predetermined stabilization time after writing the data.

(5) The memory controller according to any of (1) to (3),
wherein the nonvolatile memory is accessed on a page-by-page basis, using a page address,
the write control unit continuously writes data of a plurality of pages,
the verification unit performs the verification on a page-by-page basis in order in which the data is written, and
the determination unit determines that a state of corresponding memory cells is stable upon the verification.

(6) The memory controller according to (5), further including a rewrite address information holding unit that holds rewrite address information, the rewrite address information being information on a page address in the nonvolatile memory where the rewriting is to be performed,
wherein the verification unit continuously performs the verification after writing the data of a plurality of pages, and allows the rewrite address information holding unit to hold rewrite address information based on a result of the verification, and
the write control unit performs the rewriting on the basis of the held rewrite address information.

(7) The memory controller according to (5), further including a verification address information holding unit that holds verification address information, the verification address information being information on a page address in the nonvolatile memory where the verification is to be performed,
wherein when the write control unit performs the writing and the rewriting, the write control unit allows the verification address information holding unit to hold, as the verification address information, information on a page address where the writing and the rewriting have been performed, and
the verification unit performs the verification on the basis of the held verification address information.

(8) The memory controller according to any of (1) to (3),
wherein the nonvolatile memory is accessed on a page-by-page basis, using a page address,
the write control unit continuously writes data of a plurality of pages,
the verification unit performs the verification on a page-by-page basis in order in which the data is written, and
when a number of pages of the write data is greater than or equal to a number of pages with a stabilized state, the determination unit determines that a state of corresponding memory cells is stable upon the verification, and when the number of pages of the write data is less than the number of pages with a stabilized state, the determination unit waits for predetermined stabilization time to have elapsed, and then determines that the state of the corresponding memory cells is stable, the number of pages with a stabilized state being a number of pages where write time is reached, the write time corresponding to the predetermined stabilization time after writing data in the nonvolatile memory.

(9) A memory controller including:
a write control unit that writes data in a nonvolatile memory including a memory cell, the memory cell having an unstable state period after writing data;
a determination unit that determines whether a state of the memory cell after writing the data is stable; and
a verification/writing unit that performs verification where read data is compared with write data involved in the writing, and performs rewriting of the write data based on a result of the verification, the read data being read from the memory cell where the data is written on the basis of a result of the determination.

(10) A storage apparatus including:
a nonvolatile memory including a memory cell, the memory cell having an unstable state period after writing data;
a determination unit that determines whether a state of the memory cell after writing data is stable in the nonvolatile memory;
a verification unit that performs verification by comparing read data with write data involved in the writing, the read data being read from the memory cell where the data is written on the basis of a result of the determination; and
a write control unit that performs writing of the data and rewriting of the write data based on a result of the verification.

(11) An information processing system including:
a nonvolatile memory including a memory cell, the memory cell having an unstable state period after writing data;
a memory controller that controls the nonvolatile memory; and
a host computer that accesses the nonvolatile memory through the memory controller,
wherein the memory controller includes:
a determination unit that determines whether a state of the memory cell after writing data is stable in the nonvolatile memory;
a verification unit that performs verification by comparing read data with write data involved in the writing, the read data being read from the memory cell where the data is written on the basis of a result of the determination; and
a write control unit that performs writing of the data and rewriting of the write data based on a result of the comparison.

(12) A method for controlling a nonvolatile memory, the method including:
a determining step of determining whether a state of a memory cell after writing data is stable in a nonvolatile memory including the memory cell, the memory cell having an unstable state period after writing data;
a verifying step of performing verification by comparing read data with write data involved in the writing, the read data being read from the memory cell where the data is written on the basis of a result of the determination; and
a write controlling step of performing writing of the data and rewriting of the write data based on a result of the comparison.

REFERENCE SIGNS LIST

100 Host computer
101, 201, 301 Bus apparatus
107 Power supply voltage monitoring unit
109, 208 Signal line
110 Processor
120 DRAM
130, 330 Memory controller interface
150 Switching unit
200 Memory controller
210 Processor
220 RAM
230 Host interface
240 DRAM interface
250 ECC processing unit
260 ROM
270 Memory interface
280 Determination unit
281 Timer unit
282 Number-of-written-pages determination unit
283 Memory cell stable state determination unit
290 Input port
291, 292 Write control unit
293 Verification unit
294 Write condition setting unit
295 Verification address information holding unit
296 Rewrite address information holding unit
297 DRAM control unit
298 Address conversion information holding unit
299 Verification/writing unit
300 Memory
310 Control unit
320 Working memory
340 Address decoder
350 Memory cell array
360 Buffer

The invention claimed is:

1. A memory controller comprising: determination circuitry that makes a determination as to whether a state of a memory cell after a writing of first write data is stable in a nonvolatile memory including the memory cell, the memory cell having an unstable state period after the writing of the first write data; verification circuitry that performs verification by comparing read data with second write data involved in the writing of the first write data, the read data being read from the memory cell where the first write data is written; and write control circuitry that performs writing of the first write data and rewriting of the first write data based on a result of the verification,
wherein the nonvolatile memory is accessed on a page-by-page basis, using a page address, the write control circuitry continuously writes data of a plurality of pages, the verification circuitry performs the verification on a page-by-page basis in order in which the data of the plurality of pages is written, and when a number of pages of the written data of the plurality of pages is greater than or equal to a number of pages with a stabilized state, the determination circuitry determines that a state of corresponding memory cells is stable upon the verification, and when the number of pages of the written data of the plurality of pages is less than the number of pages with a stabilized state, the determination circuitry waits for a predetermined stabilization time to have elapsed, and then determines that the state of the corresponding memory cells is stable, the number of pages with a stabilized state being a number of pages where a write time is reached, the write time corresponding to the predetermined stabilization time after writing data in the nonvolatile memory.

2. The memory controller according to claim 1, wherein in the nonvolatile memory, when reading is performed immediately after writing the first write data, the first write data is corrupted.

3. The memory controller according to claim 1, wherein in the nonvolatile memory, immediately after writing the first write data, the first write data is not read normally.

4. The memory controller according to claim 1, wherein the determination circuitry makes the determination on the basis of a lapse of predetermined stabilization time after writing the first write data.

5. The memory controller according to claim 1, wherein the nonvolatile memory is accessed on a page-by-page basis, using a page address, the write control circuitry continuously writes data of a plurality of pages, the verification circuitry performs the verification on a page-by-page basis in order in which the data of the plurality of pages is written, and the determination circuitry determines that a state of corresponding memory cells is stable upon the verification.

6. The memory controller according to claim 5, further comprising a rewrite address information holding circuitry that holds rewrite address information, the rewrite address information being information on a page address in the nonvolatile memory where the rewriting is to be performed, wherein the verification circuitry continuously performs the verification after writing the data of a plurality of pages, and allows the rewrite address information holding circuitry to hold rewrite address information based on a result of the verification, and the write control circuitry performs the rewriting on the basis of the held rewrite address information.

7. The memory controller according to claim 5, further comprising a verification address information holding circuitry that holds verification address information, the verification address information being information on a page address in the nonvolatile memory where the verification is to be performed, wherein when the write control circuitry performs the writing and the rewriting, the write control circuitry allows the verification address information holding circuitry to hold, as the verification address information, information on a page address where the writing and the rewriting have been performed, and the verification circuitry performs the verification on the basis of the held verification address information.

8. A memory controller comprising: write control circuitry that writes first write data in a nonvolatile memory including a memory cell from second write data, the memory cell having an unstable state period after the writing of the first write data; determination circuitry that makes a determination as to whether a state of the memory cell after writing the first write data is stable; and verification/writing circuitry that performs verification where read data is compared with second write data involved in the writing of the first write data, and performs rewriting of the first write data based on a result of the verification, the read data being read from the memory cell where the first write data is written,
wherein the nonvolatile memory is accessed on a page-by-page basis, using a page address, the write control circuitry continuously writes data of a plurality of pages, the verification/writing circuitry performs the verification on a page-by-page basis in order in which the data of the plurality of pages is written, and when a number of pages of the written data of the plurality of pages is greater than or equal to a number of pages with a stabilized state, the determination circuitry determines that a state of corresponding memory cells is stable upon the verification, and when the number of pages of the written data of the plurality of pages is less than the number of pages with a stabilized state, the determination circuitry waits for a predetermined stabilization time to have elapsed, and then determines that the state of the corresponding memory cells is stable, the number of pages with a stabilized state being a number of pages where a write time is reached, the write time corresponding to the predetermined stabilization time after writing data in the nonvolatile memory.

9. A storage apparatus comprising: a nonvolatile memory including a memory cell, the memory cell having an unstable state period after a writing of first write data; determination circuitry that makes a determination as to whether a state of the memory cell after the writing of the first write data is stable in the nonvolatile memory; verification circuitry that performs verification by comparing read data with second write data involved in the writing of the first write data, the read data being read from the memory cell where the first write data is written; and write control circuitry that performs writing of the first write data and rewriting of the first write data based on a result of the verification,
wherein the nonvolatile memory is accessed on a page-by-page basis, using a page address, the write control circuitry continuously writes data of a plurality of pages, the verification circuitry performs the verification on a page-by-page basis in order in which the data of the plurality of pages is written, and when a number of pages of the written data of the plurality of pages is greater than or equal to a number of pages with a stabilized state, the determination circuitry determines that a state of corresponding memory cells is stable upon the verification, and when the number of pages of the written data of the plurality of pages is less than the number of pages with a stabilized state, the determination circuitry waits for a predetermined stabilization time to have elapsed, and then determines that the state of the corresponding memory cells is stable, the number of pages with a stabilized state being a number of pages where a write time is reached, the write time corresponding to the predetermined stabilization time after writing data in the nonvolatile memory.

10. An information processing system comprising: a nonvolatile memory including a memory cell, the memory cell having an unstable state period after a writing of first write data; a memory controller that controls the nonvolatile memory; and a host computer that accesses the nonvolatile memory through the memory controller, wherein the memory controller includes: determination circuitry that makes a determination as to whether a state of the memory cell after the writing of the first write data is stable in the nonvolatile memory; verification circuitry that performs verification by comparing read data with second write data involved in the writing of the first write data, the read data being read from the memory cell where the first write data is written; and write control circuitry that performs writing of the first write data and rewriting of the first write data based on a result of the comparison,
wherein the nonvolatile memory is accessed on a page-by-page basis, using a page address, the write control circuitry continuously writes data of a plurality of pages, the verification circuitry performs the verification on a page-by-page basis in order in which the data of the plurality of pages is written, and when a number of pages of the written data of the plurality of pages is greater than or equal to a number of pages with a stabilized state, the determination circuitry determines that a state of corresponding memory cells is stable upon the verification, and when the number of pages of the written data of the plurality of pages is less than the number of pages with a stabilized state, the determination circuitry waits for a predetermined stabilization time to have elapsed, and then determines that the state of the corresponding memory cells is stable, the number of pages with a stabilized state being a number of pages where a write time is reached, the write time corresponding to the predetermined stabilization time after writing data in the nonvolatile memory.

11. A method for controlling a nonvolatile memory, the method comprising: a determining step of making a determination as to whether a state of a memory cell after a writing of first write data is stable in the nonvolatile memory including the memory cell by a determination circuitry, the memory cell having an unstable state period after the writing of the first write data; a verifying step of performing verification by comparing read data with second write data involved in the writing of the first write data by a verification circuitry, the read data being read from the memory cell where the first write data is written; and a write controlling step of performing writing of the first write data and rewriting of the first write data based on a result of the comparison by a write control circuitry, wherein the nonvolatile memory is accessed on a page-by-page basis, using a page address, the write control circuitry continuously writes data of a plurality of pages, the verification circuitry performs the verification on a page-by-page basis in order in which the data of the plurality of pages is written, and when a number of pages of the written data of the plurality of pages is greater than or equal to a number of pages with a stabilized state, the determination circuitry determines that the state of corresponding memory cells is stable upon the verification, and when the number of pages of the written data of the plurality of pages is less than the number of pages with a stabilized state, the determination circuitry waits for a predetermined stabilization time to have elapsed, and then determines that the state of the corresponding memory cells is stable, the number of pages with a stabilized state being a number of pages where a write time is reached, the write time corresponding to the predetermined stabilization time after writing data in the nonvolatile memory.

* * * * *